(12) United States Patent
Kinney et al.

(10) Patent No.: US 11,158,670 B2
(45) Date of Patent: Oct. 26, 2021

(54) MAGNETIC STRUCTURES, SEMICONDUCTOR STRUCTURES, AND SEMICONDUCTOR DEVICES

(71) Applicant: Micron Technology, Inc., Boise, ID (US)

(72) Inventors: Wayne I. Kinney, Boise, ID (US); Witold Kula, Gilroy, CA (US); Stephen J. Kramer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/796,677

(22) Filed: Feb. 20, 2020

(65) Prior Publication Data

US 2020/0194497 A1    Jun. 18, 2020

Related U.S. Application Data

(63) Continuation of application No. 16/112,125, filed on Aug. 24, 2018, now Pat. No. 10,586,830, which is a
(Continued)

(51) Int. Cl.
*H01L 27/22* (2006.01)
*G11C 11/16* (2006.01)
(Continued)

(52) U.S. Cl.
CPC .......... *H01L 27/222* (2013.01); *G11C 11/161* (2013.01); *G11C 11/1673* (2013.01);
(Continued)

(58) Field of Classification Search
CPC . H01L 43/08; H01L 27/228; H01L 29/66984; H01L 27/222; H01L 29/82;
(Continued)

(56) References Cited

U.S. PATENT DOCUMENTS 4,882,936 A   11/1989  Garshelis
5,768,069 A    6/1998  Mauri
(Continued)

FOREIGN PATENT DOCUMENTS

CN     101232073 A    7/2008
EP      1353443 A2   10/2003
(Continued)

OTHER PUBLICATIONS

Apalkov et al., Comparison of Scaling of In-Plane and Perpendicular Spin Transfer Switching Technologies by Micromagnetic Simulation, IEEE Transactions on Magnetics, vol. 46, Issue 6, (Jun. 2010), pp. 2240-2243 (abstract only).
(Continued)

*Primary Examiner* — Karen Kusumakar
(74) *Attorney, Agent, or Firm* — TraskBritt

(57) ABSTRACT

Memory cells are disclosed. Magnetic regions within the memory cells include an alternating structure of magnetic sub-regions and coupler sub-regions. The coupler material of the coupler sub-regions antiferromagnetically couples neighboring magnetic sub-regions and effects or encourages a vertical magnetic orientation exhibited by the neighboring magnetic sub-regions. Neighboring magnetic sub-regions, spaced from one another by a coupler sub-region, exhibit oppositely directed magnetic orientations. The magnetic and coupler sub-regions may each be of a thickness tailored to form the magnetic region in a compact structure. Interference between magnetic dipole fields emitted from the magnetic region on switching of a free region in the memory cell may be reduced or eliminated. Also disclosed are semiconductor device structures, spin torque transfer magnetic random-access memory (STT-MRAM) systems, and methods of fabrication.

18 Claims, 8 Drawing Sheets

Related U.S. Application Data continuation of application No. 15/642,577, filed on Jul. 6, 2017, now Pat. No. 10,121,824, which is a continuation of application No. 15/168,054, filed on May 29, 2016, now Pat. No. 9,711,565, which is a continuation of application No. 14/728,268, filed on Jun. 2, 2015, now Pat. No. 9,356,229, which is a continuation of application No. 13/527,262, filed on Jun. 19, 2012, now Pat. No. 9,054,030.

(51) Int. Cl.
*H01F 10/32* (2006.01)
*H01L 43/08* (2006.01)
*H01L 43/02* (2006.01)
*H01L 43/10* (2006.01)

(52) U.S. Cl.
CPC ...... *G11C 11/1675* (2013.01); *H01F 10/3218* (2013.01); *H01L 43/02* (2013.01); *H01L 43/08* (2013.01); *H01L 43/10* (2013.01); *H01F 10/329* (2013.01); *H01L 27/228* (2013.01)

(58) Field of Classification Search
CPC ....... G11C 11/161; G11C 11/16; G11C 11/14; G11C 11/15
See application file for complete search history.

(56) References Cited

U.S. PATENT DOCUMENTS

| | | | |
|---|---|---|---|
| 6,166,948 A | 12/2000 | Parkin et al. |
| 6,258,470 B1 | 7/2001 | Sakakima et al. |
| 6,275,363 B1 | 8/2001 | Gill |
| 6,363,000 B2 | 3/2002 | Perner et al. |
| 6,387,476 B1 | 5/2002 | Iwasaki et al. |
| 6,483,741 B1 | 11/2002 | Iwasaki et al. |
| 6,560,135 B2 | 5/2003 | Matsuoka et al. |
| 6,611,405 B1 | 8/2003 | Inomata et al. |
| 6,703,249 B2 | 3/2004 | Okazawa et al. |
| 6,771,534 B2 | 8/2004 | Stipe |
| 6,806,096 B1 | 10/2004 | Kim et al. |
| 6,845,038 B1 | 1/2005 | Shukh |
| 6,970,376 B1 | 11/2005 | Fukuzumi |
| 6,980,468 B1 | 12/2005 | Ounadjela et al. |
| 6,992,359 B2 | 1/2006 | Nguyen et al. |
| 6,998,150 B2 | 2/2006 | Li et al. |
| 7,026,671 B2 | 4/2006 | Mizuguchi et al. |
| 7,095,933 B2 | 8/2006 | Barth |
| 7,130,167 B2 | 10/2006 | Gill |
| 7,189,583 B2 | 3/2007 | Drewes |
| 7,230,265 B2 | 6/2007 | Kaiser et al. |
| 7,239,489 B2 | 7/2007 | Lin et al. |
| 7,274,080 B1 | 9/2007 | Parkin |
| 7,372,674 B2 | 5/2008 | Gill |
| 7,378,698 B2 | 5/2008 | Ha et al. |
| 7,379,280 B2 | 5/2008 | Fukumoto et al. |
| 7,486,552 B2 | 2/2009 | Apalkov et al. |
| 7,488,609 B1 | 2/2009 | Lin et al. |
| 7,514,160 B2 | 4/2009 | Nagahama et al. |
| 7,563,486 B2 | 7/2009 | Barth |
| 7,564,152 B1 | 7/2009 | Clark et al. |
| 7,602,033 B2 | 10/2009 | Zhao et al. |
| 7,660,153 B2 | 2/2010 | Yamane et al. |
| 7,682,841 B2 | 3/2010 | Dahmani et al. |
| 7,732,881 B2 | 6/2010 | Wang |
| 7,750,421 B2 | 7/2010 | Horng et al. |
| 7,791,844 B2 | 9/2010 | Carey et al. |
| 7,835,173 B2 | 11/2010 | Ma et al. |
| 7,863,060 B2 | 1/2011 | Belen et al. |
| 7,885,105 B2 | 2/2011 | Li et al. |
| 7,919,794 B2 | 4/2011 | Gu et al. |
| 7,929,370 B2 | 4/2011 | Min |
| 7,932,572 B2 | 4/2011 | Tsujiuchi |
| 7,948,044 B2 | 5/2011 | Horng et al. |
| 8,009,465 B2 | 8/2011 | Nakayama et al. |
| 8,043,732 B2 | 10/2011 | Anderson et al. |
| 8,048,492 B2 | 11/2011 | Fukuzawa et al. |
| 8,068,317 B2 | 11/2011 | Gill |
| 8,080,432 B2 | 12/2011 | Horng et al. |
| 8,089,137 B2 | 1/2012 | Lung et al. |
| 8,102,700 B2 | 1/2012 | Liu et al. |
| 8,138,561 B2 | 3/2012 | Horng et al. |
| 8,223,539 B2 | 7/2012 | Smythe et al. |
| 8,324,697 B2 | 12/2012 | Worledge |
| 8,334,148 B2 | 12/2012 | Jeong et al. |
| 8,338,004 B2 | 12/2012 | Shin et al. |
| 8,357,962 B2 | 1/2013 | Marukame et al. |
| 8,385,107 B2 | 2/2013 | Prejbeanu |
| 8,411,498 B2 | 4/2013 | Kim et al. |
| 8,422,286 B2 | 4/2013 | Ranjan et al. |
| 8,470,462 B2 | 6/2013 | Horng et al. |
| 8,487,390 B2 | 7/2013 | Dimitrov et al. |
| 8,492,169 B2 | 7/2013 | Cao et al. |
| 8,570,798 B2 | 10/2013 | Meade et al. |
| 8,587,043 B2 | 11/2013 | Natori et al. |
| 8,604,573 B2 | 12/2013 | Yamakawa et al. |
| 8,623,452 B2 | 1/2014 | Zhou |
| 8,692,342 B2 | 4/2014 | Oh et al. |
| 8,704,320 B2 | 4/2014 | Zhu et al. |
| 8,749,003 B2 | 6/2014 | Horng et al. |
| 8,779,538 B2 | 7/2014 | Chen et al. |
| 8,803,265 B2 | 8/2014 | Lim et al. |
| 8,823,118 B2 | 9/2014 | Horng et al. |
| 8,923,038 B2 | 12/2014 | Kula et al. |
| 9,269,888 B2 | 2/2016 | Meade et al. |
| 9,281,466 B2 | 3/2016 | Sandhu et al. |
| 9,349,945 B2 | 5/2016 | Sandhu et al. |
| 2001/0012188 A1 | 8/2001 | Hasegawa et al. |
| 2002/0089874 A1 | 7/2002 | Nickel et al. |
| 2002/0105827 A1 | 8/2002 | Redon et al. |
| 2003/0011939 A1 | 1/2003 | Gill |
| 2003/0064569 A1 | 4/2003 | Takayama et al. |
| 2003/0103371 A1 | 6/2003 | Kim et al. |
| 2003/0199104 A1 | 10/2003 | Leuschner et al. |
| 2004/0075959 A1 | 4/2004 | Gill |
| 2004/0091744 A1 | 5/2004 | Carey et al. |
| 2004/0174740 A1 | 9/2004 | Lee et al. |
| 2004/0224243 A1 | 11/2004 | Yoshizawa et al. |
| 2004/0233760 A1 | 11/2004 | Guo et al. |
| 2005/0036361 A1 | 2/2005 | Fukuzumi |
| 2005/0068683 A1 | 3/2005 | Gill |
| 2005/0087511 A1 | 4/2005 | Sharma et al. |
| 2005/0106810 A1 | 5/2005 | Pakala et al. |
| 2005/0164414 A1 | 7/2005 | Deak |
| 2005/0173698 A1 | 8/2005 | Drewes |
| 2005/0189574 A1 | 9/2005 | Nguyen et al. |
| 2005/0211973 A1 | 9/2005 | Mori et al. |
| 2006/0038213 A1 | 2/2006 | Mori et al. |
| 2006/0042930 A1 | 3/2006 | Mauri |
| 2006/0114714 A1 | 6/2006 | Kanegae |
| 2006/0118842 A1 | 6/2006 | Iwata |
| 2006/0132990 A1 | 6/2006 | Morise et al. |
| 2006/0261425 A1 | 11/2006 | Suemitsu et al. |
| 2007/0008661 A1 | 1/2007 | Min et al. |
| 2007/0035890 A1 | 2/2007 | Sbiaa |
| 2007/0053112 A1 | 3/2007 | Papworth |
| 2007/0086121 A1 | 4/2007 | Nagase et al. |
| 2007/0217071 A1 | 9/2007 | Inamura et al. |
| 2007/0297220 A1 | 12/2007 | Yoshikawa et al. |
| 2008/0164502 A1 | 7/2008 | Fukumoto et al. |
| 2008/0164548 A1 | 7/2008 | Ranjan et al. |
| 2008/0179699 A1 | 7/2008 | Horng et al. |
| 2008/0180859 A1 | 7/2008 | Ueda et al. |
| 2008/0205130 A1 | 8/2008 | Sun et al. |
| 2008/0225581 A1 | 9/2008 | Yamane et al. |
| 2008/0253038 A1 | 10/2008 | Nakabayashi et al. |
| 2008/0278867 A1 | 11/2008 | Fukumoto et al. |
| 2009/0039450 A1 | 2/2009 | Lee et al. |
| 2009/0079018 A1 | 3/2009 | Nagase et al. |
| 2009/0080238 A1 | 3/2009 | Yoshikawa et al. |
| 2009/0096043 A1 | 4/2009 | Min et al. |
| 2009/0108383 A1 | 4/2009 | Horng et al. |
| 2009/0190262 A1 | 7/2009 | Murakami et al. |

(56) References Cited

U.S. PATENT DOCUMENTS

| | | |
|---|---|---|
| 2009/0229111 A1 | 9/2009 | Zhao et al. |
| 2009/0257151 A1 | 10/2009 | Zhang et al. |
| 2010/0034014 A1 | 2/2010 | Ohno et al. |
| 2010/0039855 A1 | 2/2010 | Victora et al. |
| 2010/0080036 A1 | 4/2010 | Liu et al. |
| 2010/0080048 A1 | 4/2010 | Liu et al. |
| 2010/0102406 A1 | 4/2010 | Xi et al. |
| 2010/0109110 A1 | 5/2010 | Wang et al. |
| 2010/0110783 A1 | 5/2010 | Liu et al. |
| 2010/0148167 A1 | 6/2010 | Whig et al. |
| 2010/0171086 A1 | 7/2010 | Lung et al. |
| 2010/0176472 A1 | 7/2010 | Shoji |
| 2010/0177557 A1 | 7/2010 | Liu et al. |
| 2010/0177561 A1 | 7/2010 | Liu et al. |
| 2010/0200899 A1 | 8/2010 | Marukame et al. |
| 2010/0230769 A1 | 9/2010 | Ozaki et al. |
| 2010/0230770 A1 | 9/2010 | Yoshikawa et al. |
| 2010/0240151 A1 | 9/2010 | Belen et al. |
| 2010/0327248 A1 | 12/2010 | Khoueir et al. |
| 2011/0007429 A1 | 1/2011 | Dimitrov et al. |
| 2011/0007543 A1 | 1/2011 | Khoury |
| 2011/0014500 A1 | 1/2011 | Horng et al. |
| 2011/0031569 A1 | 2/2011 | Watts et al. |
| 2011/0049657 A1 | 3/2011 | Tsukamoto et al. |
| 2011/0049658 A1 | 3/2011 | Zheng et al. |
| 2011/0051503 A1 | 3/2011 | Hu et al. |
| 2011/0062537 A1 | 3/2011 | Oh et al. |
| 2011/0064969 A1 | 3/2011 | Chen et al. |
| 2011/0096443 A1 | 4/2011 | Zhang et al. |
| 2011/0121366 A1 | 5/2011 | Or-Bach et al. |
| 2011/0145514 A1 | 6/2011 | Lee et al. |
| 2011/0149646 A1 | 6/2011 | Liu et al. |
| 2011/0149647 A1 | 6/2011 | Kim et al. |
| 2011/0149670 A1 | 6/2011 | Heo et al. |
| 2011/0159316 A1 | 6/2011 | Wang et al. |
| 2011/0170339 A1 | 7/2011 | Wunderlich et al. |
| 2011/0170341 A1 | 7/2011 | Butler |
| 2011/0211389 A1 | 9/2011 | Yoshikawa et al. |
| 2011/0222335 A1 | 9/2011 | Yoshikawa et al. |
| 2011/0241138 A1 | 10/2011 | Hsieh et al. |
| 2011/0260272 A1 | 10/2011 | Lee et al. |
| 2011/0260274 A1 | 10/2011 | Zheng et al. |
| 2011/0266642 A1 | 11/2011 | Viala et al. |
| 2011/0269251 A1 | 11/2011 | Kim et al. |
| 2011/0293967 A1 | 12/2011 | Zhang et al. |
| 2011/0303995 A1 | 12/2011 | Worledge |
| 2011/0303997 A1 | 12/2011 | Wang et al. |
| 2011/0309418 A1 | 12/2011 | Nakayama et al. |
| 2012/0012952 A1 | 1/2012 | Chen et al. |
| 2012/0012953 A1 | 1/2012 | Lottis et al. |
| 2012/0012954 A1 | 1/2012 | Yamada et al. |
| 2012/0015099 A1 | 1/2012 | Sun et al. |
| 2012/0018823 A1 | 1/2012 | Huai et al. |
| 2012/0040207 A1 | 2/2012 | Horng et al. |
| 2012/0043631 A1 | 2/2012 | Ohmori et al. |
| 2012/0069640 A1 | 3/2012 | Nagase et al. |
| 2012/0069647 A1 | 3/2012 | Kramer et al. |
| 2012/0074511 A1 | 3/2012 | Takahashi et al. |
| 2012/0075922 A1 | 3/2012 | Yamada et al. |
| 2012/0075927 A1 | 3/2012 | Chen et al. |
| 2012/0106233 A1 | 5/2012 | Katti |
| 2012/0134201 A1 | 5/2012 | Ogimoto |
| 2012/0135273 A1 | 5/2012 | Horng et al. |
| 2012/0146167 A1 | 6/2012 | Huai et al. |
| 2012/0155156 A1 | 6/2012 | Watts et al. |
| 2012/0205758 A1 | 8/2012 | Jan et al. |
| 2012/0217594 A1 | 8/2012 | Kajiyama |
| 2012/0218813 A1 | 8/2012 | Oh et al. |
| 2012/0225499 A1 | 9/2012 | Nozieres et al. |
| 2012/0236631 A1 | 9/2012 | Park et al. |
| 2012/0241878 A1 | 9/2012 | Hu et al. |
| 2012/0267733 A1 | 10/2012 | Hu et al. |
| 2012/0280336 A1 | 11/2012 | Jan et al. |
| 2012/0286382 A1 | 11/2012 | Jan et al. |
| 2012/0299134 A1 | 11/2012 | Jan et al. |
| 2012/0299137 A1 | 11/2012 | Worledge |
| 2013/0005052 A1 | 1/2013 | Hu et al. |
| 2013/0028013 A1 | 1/2013 | Ikeda et al. |
| 2013/0032911 A1 | 2/2013 | Jung et al. |
| 2013/0042081 A1 | 2/2013 | Park et al. |
| 2013/0059168 A1 | 3/2013 | Tahmasebi et al. |
| 2013/0064011 A1 | 3/2013 | Liu et al. |
| 2013/0069185 A1 | 3/2013 | Saida et al. |
| 2013/0140658 A1 | 6/2013 | Yamane et al. |
| 2013/0146996 A1 | 6/2013 | Yu et al. |
| 2013/0228884 A1 | 9/2013 | Zheng et al. |
| 2013/0229866 A1 | 9/2013 | Ranjan et al. |
| 2013/0234269 A1 | 9/2013 | Oh et al. |
| 2013/0250661 A1 | 9/2013 | Sandhu et al. |
| 2013/0313665 A1 | 11/2013 | Rhie et al. |
| 2013/0334630 A1 | 12/2013 | Kula et al. |
| 2013/0334631 A1 | 12/2013 | Kinney et al. |
| 2014/0008742 A1 | 1/2014 | Chen et al. |
| 2014/0027869 A1 | 1/2014 | Lee et al. |
| 2014/0099735 A1 | 4/2014 | Horng et al. |
| 2014/0191346 A1 | 7/2014 | Oh et al. |
| 2015/0028439 A1 | 1/2015 | Kula et al. |
| 2015/0069556 A1 | 3/2015 | Yamakawa et al. |
| 2015/0076485 A1 | 3/2015 | Sandhu et al. |
| 2015/0076633 A1 | 3/2015 | Siddik et al. |
| 2015/0249202 A1 | 9/2015 | Siddik et al. |
| 2015/0263269 A1 | 9/2015 | Kinney et al. |
| 2015/0303372 A1 | 10/2015 | Meade et al. |
| 2016/0211440 A1 | 7/2016 | Siddik et al. |

FOREIGN PATENT DOCUMENTS

| | | |
|---|---|---|
| EP | 2015307 A1 | 1/2009 |
| EP | 2385548 A1 | 11/2011 |
| EP | 2541554 A1 | 1/2013 |
| GB | 2343308 A | 5/2000 |
| JP | 2002-314049 A | 10/2002 |
| JP | 2004-104076 A | 4/2004 |
| JP | 2006-179524 A | 7/2006 |
| JP | 2008-010590 A | 1/2008 |
| JP | 2009-081216 A | 4/2009 |
| JP | 2009-194366 A | 8/2009 |
| JP | 2011-061204 A | 3/2011 |
| JP | 2012-043967 A | 3/2012 |
| JP | 2012-064774 A | 3/2012 |
| KR | 10-2004-0092342 A | 11/2004 |
| KR | 10-2007-0094431 A | 9/2007 |
| KR | 10-2008-0029852 A | 4/2008 |
| KR | 10-2012-0008295 | 1/2012 |
| WO | 2010/026831 A1 | 3/2010 |
| WO | 2010/134378 A1 | 11/2010 |
| WO | 2011/001746 A1 | 1/2011 |
| WO | 2011/149274 A2 | 12/2011 |
| WO | 2011/159422 A1 | 12/2011 |
| WO | 2012/009232 A1 | 1/2012 |
| WO | 2012/128891 A1 | 9/2012 |
| WO | 2012/160937 A1 | 11/2012 |

OTHER PUBLICATIONS

Auwarter et al, Co on h—BN/Ni(1 1 1): From Island to Island—Chain Formation and Co Intercalation, Surface Science, vol. 511, (2002), pp. 379-386.

Bai et al., Boron Diffusion Induced Symmetry Reduction and Scattering in CoFeB/MgO/CoFeB Magnetic Tunnel Junctions, Phys. Rev. B, vol. 87, (Jan. 23, 2013), pp. 014114 (abstract only).

Braun et al., Strain-Induced Perpendicular Magnetic Anisotropy in Ultrathin Ni Films on Cu3Au(0 0 1), Journal of Magnetism and Magnetic Materials, vol. 171, (1997), pp. 16-28.

Carrey et al., Influence of Interface Alloying on the Magnetic Properties of Co/Pd Multilayers, Applied Physics Letters, vol. 83, No. 25, (Dec. 22, 2003), pp. 5259-5261.

Cha et al., Atomic-Scale Spectroscopic Imaging of CoFeB/Mg—B—O/CoFeB Magnetic Tunnel Junctions, Applied Physics Letters, vol. 95, (2009), pp. 032506-1-032506-3.

(56) References Cited

OTHER PUBLICATIONS

Chen et al., Advances and Future Prospects of Spin-Transfer Torque Random Access Memory, IEEE Transactions on Magnetics, vol. 46, No. 6, (Jun. 2010), pp. 1873-1878.

Chen et al., Magnetic Cell Structures, and Methods of Fabrication, U.S. Appl. No. filed Dec. 2, 2014., 14/558,367.

Chinese Office Action and Search Report from Chinese Patent Application No. 201380032769.5, dated Jul. 4, 2016, 15 pages with English translation.

Chinese Second Office Action and Search Report from Chinese Patent Application No. 201380032769.5, dated Jan. 16, 2017, 7 pages with English translation.

Diao et al., Spin Transfer Switching in Dual MgO Magnetic Tunnel Junctions, Applied Physics Letters, vol. 90, (2007), pp. 132508-1-132508-3.

Djayaprawira et al., 230% Room-Temperature Magnetoresistance in CoFeB/MgO/CoFeB Magnetic Tunnel Junctions, Applied Physics Letters, vol. 86, Issue 9, (2005), 2 pages (abstract only).

European Examination Report from European Application No. 13807878.7, dated Jul. 27, 2018, 4 pages.

Extended European Search Report for European Application No. 13807878.7, (dated Feb. 1, 2016), 8 pages.

Farle et al., The Temperature Dependence of Magnetic Anisotropy in Ultra-Thin Films, Journal of Magnetism and Magnetic Materials, vol. 165, (1997), pp. 74-77.

Gan et al., Origin of the Collapse of Tunnel Magnetoresistance at High Annealing Temperature in CoFeB/MgO Perpendicular Magnetic Tunnel Junctions, Applied Physics Letters, vol. 99, (2011), pp. 252507-1-252507-3.

Gao et al., Combinatorial Exploration of Rare-Earth-Free Permanent Magnets: Magnetic and Microstructural Properties of Fe—Co—W Thin Films, Applied Physics Letters, vol. 102, (2013), pp. 022419-1-022419-4.

Hayakawa et al., Dependence of Giant Tunnel Magnetoresistance of Sputtered CoFeB/MgO/CoFeB Magnetic Tunnel Junctions on MgO Barrier Thickness and Annealing Temperature, Japanese Journal of Applied Physics, vol. 44, No. 19, (2005), pp. L587-L589.

Heczko et al., Strain and Concurrent Magnetization Changes in Magnetic Shape Memory Ni—Mn—Ga Single Crystals—Experiment and Model, Materials Science and Engineering A, vol. 481-482, (2008), pp. 283-287.

Hendrych et al., Magnetic Behavior and Domain Structure in As-Quenched, Annealed, and Stress-Annealed CoFeCrSiB Ribbons, Journal of Magnetism and Magnetic Materials, vol. 321, (2009), pp. 3771-3777.

Ikeda et al., Tunnel Magnetoresistance of 604% at 300 K by Suppression of Ta Diffusion in CoFeB/MgO/CoFeB Pseudo-Spin-Valves Annealed at High Temperature, Applied Physics Letters, vol. 93, (2008), pp. 082508-1-082508-3.

International Preliminary Report on Patentability of the ISA/KR, International Application No. PCT/US2013/045119, dated Dec. 23, 2014, eight (8) pages.

International Search Report of the ISA/KR, International Application No. PCT/US2013/045119, dated Mar. 13, 2014, four (4) pages.

International Written Opinion of the ISA/KR, International Application No. PCT/US2013/045119, dated Mar. 13, 2014, seven (7) pages.

Japanese Office Action for the Japanese Patent Application No. 2015-518447, dated Feb. 23, 2016, eighteen (18) pages.

Ke et al., Oxygen-Vacancy-Induced Diffusive Scattering in Fe/MgO/Fe Magnetic Tunnel Junctions, Physical Review Letters, vol. 105, (Nov. 30, 2010), pp. 236801-1-236801-4.

Kim et al., Effect of Annealing on Magnetic Exchange Coupling in CoPt/Co Bilayer Thin Films, Journal of Applied Physics, vol. 87, No. 9, (May 1, 2000), pp. 6140-6142.

Kim et al., Enhancement of Data Retention and Write Current Scaling for Sub-20nm STT-MRAM by Utilizing Dual Interfaces for Perpendicular Magnetic Anisotropy, VLSI Technology (VLSIT), 2012 Symposium, (Jun. 12-14, 2012), 1 page (abstract only).

Ko et al, Effects of MgO and MgO/Pd Seed-Layers on Perpendicular Magnetic Anisotropy of CoPd Thin Films, Thin Solid Films, vol. 519, (2011), pp. 8252-8255.

Kohda et al., Width and Temperature Dependence of Lithography-Induced Magnetic Anisotropy in (Ga,Mn)As Wires, Physica E, vol. 42, (2010), pp. 2685-2689.

Korean Office Action for Korean Application No. 10-2015-7000836, dated May 9, 2016, 6 pages with translation.

Korean Office Action for Korean Application No. 10-2015-7000836, dated Nov. 7, 2016, 4 pages with translation.

Kula et al., Memory Cells, Methods of Fabrication, Semiconductor Device Structures, Memory Systems, and Electronic Systems, U.S. Appl. No. (filed Jul. 23, 2014)., 13/948,839.

Lavrijsen et al., Tuning the Interlayer Exchange Coupling Between Single Perpendicularly Magnetized CoFeB Layers, Appl. Phys. Lett. vol. 100, pp. 052411-1-052411-5 (2012).

Lohndorf et al., Characterization of Magnetostrictive TMR Pressure Sensors by MOKE, Journal of Magnetism and Magnetic Materials, vol. 316, (2007), pp. e223-e225.

Ma et al., NiO-Thickness Dependent Magnetic Anisotropies in Fe/NiO/Au(001) and Fe/NiO/MgO(001) Systems, Journal of Magnetism and Magnetic Materials, vol. 324, (2012), pp. 528-533.

Maehara et al., Tunnel Magnetoresistance Above 170% and Resistance-Area Product of 1 .Omega. (.mu.m)2 Attained by In Situ Annealing of Ultra-Thin MgO Tunnel Barrier, Applied Physics Express, vol. 4, (2011), 2 pages (abstract only).

Matsumoto et al., Dependence on Annealing Temperatures of Tunneling Spectra in High-Resistance CoFeB/MgO/CoFeB Magnetic Tunnel Junctions, Solid State Communications, vol. 143, (2007), pp. 574-578.

Matsumoto et al., Tunneling Spectra of Sputter-Deposited CoFeB/MgO/CoFeB Magnetic Tunnel Junctions Showing Giant Tunneling Magnetoresistance Effect, Solid State Communications, vol. 136, (2005), pp. 611-615.

Miao et al., Disturbance of Tunneling Coherence by Oxygen Vacancy in Epitaxial Fe/MgO/Fe Magnetic Tunnel Junctions, Physical Review Letters, vol. 100, (Jun. 19, 2008), pp. 246803-1-246803-4.

Miracle et al., An Assessment of Binary Metallic Glasses: Correlations Between Structure, Glass Forming Ability and Stability (Preprint), Air Force Research Laboratory, (2011), 97 pages.

Miura et al., CoFeB/MgO Based Perpendicular Magnetic Tunnel Junctions with a Stepped Structure for Symmetrizing Different Retention Times of "0" and "1" Information, 2011 Symposium on VLSI Technology (VLSIT), (Jun. 14-16, 2011), 19 pages.

Moroz et al., Modeling the Impact of Stress on Silicon Processes and Devices, Materials Science in Semiconductor Processing, vol. 6, (2003), pp. 27-36.

Moutis et al., Voltage-Induced Modification in Magnetic Coercivity of Patterned Co50Fe50 Thin Film on Piezoelectric Substrate, Journal of Magnetism and Magnetic Materials, vol. 320, (2008), pp. 1050-1055.

Nishitani et al., Magnetic Anisotropy in a Ferromagnetic (Ga,Mn)Sb Thin Film, Physica E, vol. 42, (2010), pp. 2681-2684.

Piramanayagam, S. N., Perpendicular Recording Media for Hard Disk Drives, Journal of Applied Physics, vol. 102, (2007), pp. 011301-1-011301-22.

Resnik et al., Mechanical Stress in Thin Film Microstructures on Silicon Substrate, Vacuum, vol. 80, (2005), pp. 236-240.

Rodmacq et al., Influence of Thermal Annealing on the Perpendicular Magnetic Anisotropy of Pt/Co/AlOx Trilayers, Physical Review B, vol. 79, (2009), pp. 024423-1-024423-8.

Sato et al., Perpendicular-Anisotropy CoFeB—MgO Magnetic Tunnel Junctions with a MgO/CoFeB/Ta/CoFeB/MgO Recording Structure, Applied Physics Letters, vol. 101, (2012), pp. 022414-1-022414-4.

Stone et al., Tuning of Ferromagnetism Through Anion Substitution in Ga—Mn-Pnictide Ferromagnetic Semiconductors, Physica B, vol. 401-402, (2007), pp. 454-457.

Taiwanese Office Action and Search Report of the Taiwanese Patent Application No. 102121804, dated Feb. 4, 2015, five (5) pages.

(56) References Cited

OTHER PUBLICATIONS

Tao et al., Uniform Wafer-Scale Chemical Vapor Deposition of Graphene on Evaporated Cu (1 1 1) Film with Quality Comparable to Exfoliated Monolayer, J. Physical Chemistry, vol. 116, (2012), pp. 24068-24074.

Vitos et al., The Surface Energy of Metals, Surface Science, vol. 411, (1998), pp. 186-202.

Wang et al., C-Spin Kickoff Meeting Presentation, Semiconductor Research Corp., (Mar. 26, 2013), Minneapolis, Minnesota, (available at https://www.src.org/library/publication/p066203/), 195 pages.

Wang et al., Exchange Coupling Between Ferromagnetic and Antiferromagnetic Layers Via Ru and Application for a Linear Magnetic Field Sensor, Journal of Applied Physics, vol. 99, (2006), pp. 08H703-1-08H703-3.

Wilson et al., New Materials for Micro-Scale Sensors and Actuators: An Engineering Review, Materials Science and Engineering R, vol. 56, (2007), pp. 1-129.

Worledge et al., Magnetoresistance Measurement of Unpatterned Magnetic Tunnel Junction Wafers by Current-in-Plane Tunneling, Applied Physics Letters, vol. 83, No. 1, (Jul. 7, 2013), pp. 84-86.

Worledge et al., Spin Torque Switching of Perpendicular Ta|CoFeB|MgO-Based Magnetic Tunnel Junctions, Applied Physics Letters, vol. 98, (2011), pp. 022501-1-022501-3.

Wu et al., Tuning Magnetic Anisotropies of Fe Films on Si(111) Substrate Via Direction Variation of Heating Current, Scientific Reports, vol. 3, (Mar. 26, 2013), pp. 1-5.

You et al., Spin Transfer Torque and Tunneling Magnetoresistance Dependences on Finite Bias Voltages and Insulator Barrier Energy, Thin Solid Films, vol. 519, (2011), pp. 8247-8251.

Yu et al., 1/f Noise in MgO Double-Barrier Magnetic Tunnel Junctions, Applied Physics Letters, vol. 98, (2011), pp. 112504-1-112504-3.

Zhang, Anisotropic Magnetomechanical Effect in $Tb0.3Dy0.7Fe2$ Alloy, Journal of Magnetism and Magnetic Materials, vol. 324, (2012), pp. 190-195.

Zhu et al., Magnetic Tunnel Junctions, MaterialsToday, vol. 9, No. 11, (Nov. 2006), pp. 36-45.

MAGNETIC STRUCTURES, SEMICONDUCTOR STRUCTURES, AND SEMICONDUCTOR DEVICES

CROSS-REFERENCE TO RELATED APPLICATIONS

This application is a continuation of U.S. patent application Ser. No. 16/112,125, filed Aug. 24, 2018, now U.S. Pat. No. 10,586,830, issued Mar. 10, 2020, which is a continuation of U.S. patent application Ser. No. 15/642,577, filed Jul. 6, 2017, now U.S. Pat. No. 10,121,824, issued Nov. 6, 2018, which is a continuation of U.S. patent application Ser. No. 15/168,054, filed May 29, 2016, now U.S. Pat. No. 9,711,565, issued Jul. 18, 2017, which is a continuation of U.S. patent application Ser. No. 14/728,268, filed Jun. 2, 2015, now U.S. Pat. No. 9,356,229, issued May 31, 2016, which is a continuation of U.S. patent application Ser. No. 13/527,262, filed Jun. 19, 2012, now U.S. Pat. No. 9,054,030, issued Jun. 9, 2015, the disclosure of each of which is hereby incorporated in its entirety herein by this reference.

TECHNICAL FIELD

The present disclosure, in various embodiments, relates generally to the field of memory device design and fabrication. More particularly, the present disclosure relates to design and fabrication of memory cells characterized as spin torque transfer magnetic random-access memory (STT-MRAM) cells.

BACKGROUND

Magnetic Random-Access Memory (MRAM) is a non-volatile computer memory technology based on magnetoresistance. One type of MRAM cell is a spin torque transfer MRAM (STT-MRAM) cell, such as that illustrated in FIG. 1. A conventional STT-MRAM cell includes a magnetic cell core 100 supported by a substrate 102. The magnetic cell core 100 includes at least two magnetic regions, for example, a "fixed region" 130 and a "free region 170," with a non-magnetic region 160 in between. One or more lower intermediary regions 120 and one or more upper intermediary regions 180 may be disposed under and over, respectively, the magnetic regions (e.g., the fixed region 130 and the free region 170) of the magnetic cell core 100 structure.

An STT-MRAM cell configured to exhibit perpendicular magnetic anisotropy ("PMA") includes the fixed region 130 that has a fixed, vertical magnetic orientation and includes the free region 170 that has a vertical magnetic orientation that may be switched, during operation of the cell, between a "parallel" configuration (FIG. 1) and an "anti-parallel" configuration (FIG. 2). In the parallel configuration (FIG. 1), a magnetic orientation 171 of the free region 170 is directed essentially in the same direction (e.g., north or south) as a magnetic orientation 131 of the fixed region 130, giving a lower electrical resistance across the magnetoresistive elements, i.e., the fixed region 130 and free region 170. This state of relatively low electrical resistance may be defined as a "0" state of the MRAM cell. In the anti-parallel configuration (FIG. 2), a magnetic orientation 172 of the free region 170 is directed essentially in the opposite direction (e.g., north or south) of the magnetic orientation 131 of the fixed region 130, giving a higher electrical resistance across the magnetoresistive elements, i.e., the fixed region 130 and free region 170. This state of relatively high electrical resistance may be defined as a "1" state of the MRAM cell.

Switching of the magnetic orientation 171, 172 of the free region 170 and the resulting high or low resistance states across the magnetoresistive elements enables the write and read operations of the typical MRAM cell. In operation, a programming current may be caused to flow through an access transistor and the magnetic cell core 100. The fixed region 130 within the magnetic cell core 100 polarizes the electron spin of the programming current, and torque is created as the spin-polarized current passes through the magnetic cell core 100. The spin-polarized electron current interacts with the free region 170 by exerting a torque on the free region 170. When the torque of the spin-polarized electron current passing through the magnetic cell core 100 is greater than a critical switching current density ($J_c$) of the free region 170, the torque exerted by the spin-polarized electron current is sufficient to switch the direction of the magnetization, i.e., between magnetic orientation 171 and magnetic orientation 172, of the free region 170. Thus, the programming current can be used to cause the magnetic orientation 171, 172 of the free region 170 to be aligned either parallel to (FIG. 1) or anti-parallel to (FIG. 2) the magnetic orientation 131 of the fixed region 130.

Ideally, the amount of programming current required to switch the free region 170 from the parallel configuration (FIG. 1) to the anti-parallel configuration (FIG. 2) is essentially the same amount of programming current required to switch from the anti-parallel configuration (FIG. 2) to the parallel configuration (FIG. 1). Such equal programming current for switching is referred to herein as "symmetric switching."

Though symmetric switching may be ideal, in conventional magnetic cell cores 100, one or more magnetic regions, because of their magnetic natures, may emit a magnetic dipole field, which may interfere with switching in the free region 170. For example, a magnetic dipole field 132 may be emitted by the fixed region 130, as illustrated in FIGS. 1 and 2. (Notably, though the magnetic dipole field 132 is illustrated as passing between essentially the entirety of an upper surface and a lower surface of the fixed region 130, in actuality, the fixed region 130 may have a height substantially smaller than the width of the fixed region 130, such that the magnetic dipole field 132 may be emitted from upper and lower surfaces essentially proximate only to sidewalls of the fixed region 130.) When the free region 170 is in one configuration, e.g., the parallel configuration (FIG. 1), the magnetic orientation 171 of the free region 170 may be in at least partial parallel alignment with the magnetic dipole field 132 from the fixed region 130; however, when the free region 170 is in the other configuration, e.g., the anti-parallel configuration (FIG. 2), the magnetic orientation 172 of the free region 170 may be in at least partial anti-parallel alignment with the magnetic dipole field 132. As illustrated in FIGS. 1 and 2, then, the magnetic dipole field 132 may be emitted from an upper surface of the fixed region 130 and pass through a portion of the free region 170 before arcing to enter a lower surface of the fixed region 130. When the free region 170 is in the parallel configuration (FIG. 1), both the magnetic dipole field 132 from the fixed region 130 and the magnetic orientation 171 of the free region 170 may be directed in essentially the same direction (e.g., upwards and upwards, respectively). However, when the free region 170 is in the anti-parallel configuration (FIG. 2), the magnetic dipole field 132 from the fixed region 130 and the magnetic orientation 172 of the free region 170 may be directed in essentially opposite directions (e.g., upwards and downwards, respectively). Hence, the free region 170 may have a higher affinity for being in the parallel configuration (FIG. 1) than in the anti-parallel configuration (FIG. 2) such that more programming current may be needed to switch the free region 170 to the anti-parallel configuration (FIG. 2) from the parallel configuration (FIG. 1) than is needed to switch the free region 170 from the anti-parallel configuration (FIG. 2) to the parallel configuration (FIG. 1). The presence of the magnetic dipole field 132 emitted from the fixed region 130 may, therefore, impair the ability to symmetrically switch the magnetic orientation 171, 172, of the free region 170 during operation of the MRAM cell.

Efforts have been made to eliminate the negative effects on switching due to interference from a stray magnetic dipole field 132. These efforts include, for example, attempts to neutralize the magnetic dipole field 132 by balancing magnetic orientations within the magnetic region, e.g., the fixed region 130. For example, FIG. 3 illustrates a conventional fixed region 330 including magnetic material 334 separated by conductive material 336. A coupler material 338 couples a lower region and an upper region of the fixed region 330. The conductive material 336, disposed between the magnetic material 334, causes the magnetic material 334 to exhibit a perpendicular anisotropy, i.e., vertical magnetic orientations 331, 333, while the coupler material 338 is formulated and positioned to provide anti-parallel coupling of adjacent magnetic material. Thus, the fixed region 330 is configured as a synthetic antiferromagnet (SAF) with the upper region and the lower region of the fixed region 330 coupled via a single intervening coupler material 338. The goal is that a magnetic dipole field emitted by the upper region will be effectively cancelled by a magnetic dipole field emitted by the lower region due to the opposite directions of the magnetic orientations 331, 333. However, the free region of the cell will be disposed closer to one of the upper and lower regions of the fixed region 330 such that the free region will experience the magnetic dipole field emitted by the more proximal of the upper and lower regions more strongly than the free region will experience the other magnetic dipole field. Thus, balancing the magnetic orientations of the upper and lower regions may not effectively cancel a magnetic dipole field experienced by the free region of the cell. Hence, designing a cell core structure that achieves symmetrical switching of the free region has been a challenge.

DETAILED DESCRIPTION

Figure 1:
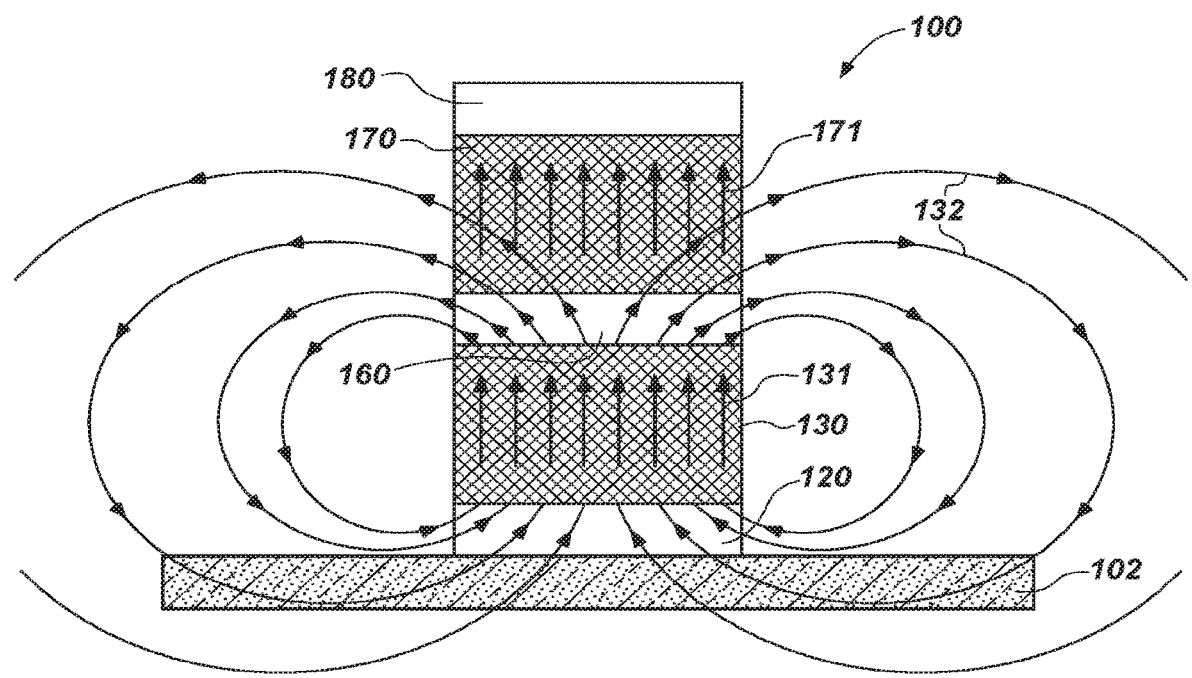
FIG. 1 is a cross-sectional, elevation, schematic illustration of a magnetic cell core of a conventional STT-MRAM cell including a free region in a parallel configuration.
Figure 2:
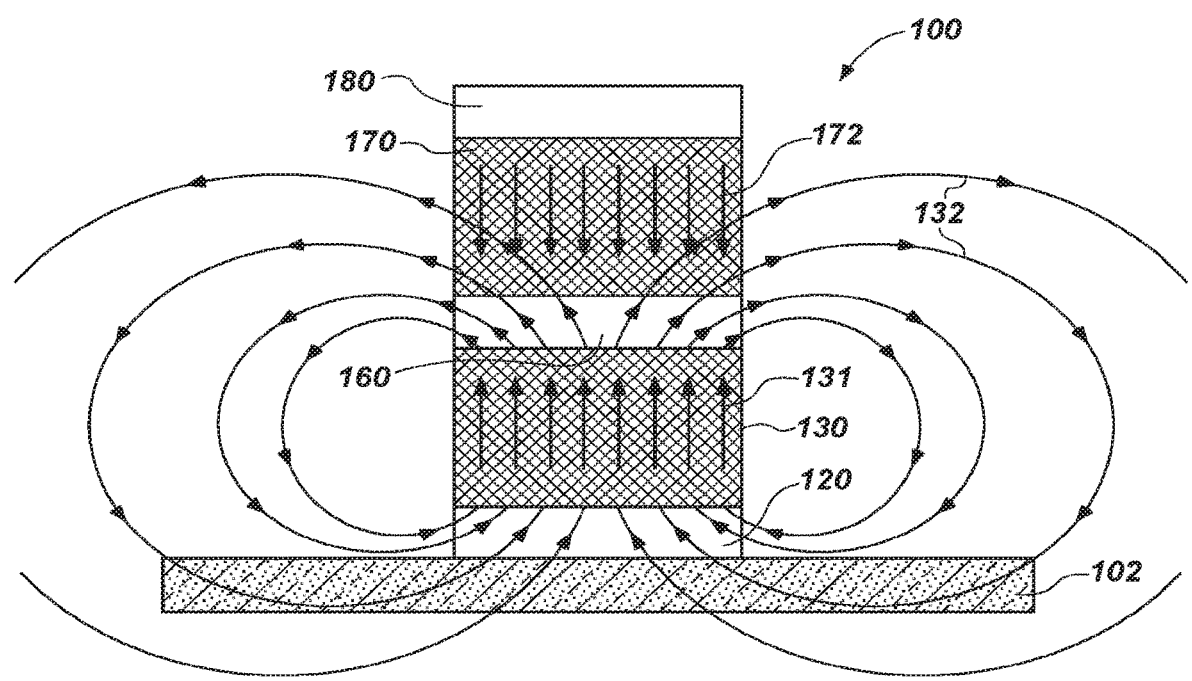
FIG. 2 is a cross-sectional, elevation, schematic illustration of the magnetic cell core of the conventional STT-MRAM cell of FIG. 1 including the free region in an anti-parallel configuration.

Memory cells, semiconductor device structures including such memory cells, memory systems, and methods of forming such memory cells are disclosed. The memory cells include a magnetic region exhibiting a vertical magnetic orientation. The magnetic region includes one or more magnetic materials and one or more coupler materials arranged such that the magnetic material alternates with the coupler material, forming what is referred to herein as an "alternating structure," in which an amount of magnetic material (i.e., a "magnetic sub-region") is disposed adjacent to an amount of coupler material (i.e., a "coupler sub-region") that is disposed adjacent to another amount of magnetic material (i.e., another magnetic sub-region). Another amount of coupler material (i.e., another coupler sub-region) may be disposed adjacent to the another amount of magnetic material (i.e., the another magnetic sub-region), and so on in sequence. Thus, the magnetic region of the memory cell includes an alternating structure of magnetic sub-regions and coupler sub-regions.

The coupler material of the alternating structure is formulated to antiferromagnetically couple neighboring magnetic material. The coupler material may also effect a vertical magnetic orientation within the neighboring magnetic material. The magnetic sub-regions coupled by a coupler sub-region exhibit oppositely directed vertical magnetic orientations. Therefore, the alternating structure of the magnetic region further includes magnetic sub-regions alternating in vertical magnetic orientation.

Because the coupler material both provides antiferromagnetic coupling and effects the vertical magnetic orientations in the neighboring magnetic material, a magnetic region with the alternating structure according to embodiments of the present disclosure may be thinner than conventional magnetic regions that have one material providing antiferromagnetic coupling and another material to effect vertical magnetic orientations. Therefore, the cell core of the memory cell may be structured with a more compact structure than a cell core of conventional memory cells.

Further, because the magnetic sub-regions within the magnetic region (e.g., the fixed region) may each be of thicknesses less than those of magnetic regions of a conventional MRAM memory cell's fixed region, a magnetic dipole field emitted by a magnetic sub-region may be smaller than a magnetic dipole field emitted by a conventional magnetic region. The minimized magnetic dipole field reduces the interference of an emitted magnetic dipole field with the switching of the free region.

Moreover, because each magnetic sub-region within the magnetic region is closely disposed to at least one neighboring magnetic sub-region exhibiting an oppositely directed vertical magnetic orientation, a magnetic dipole field emitted by one magnetic sub-region may be effectively substantially cancelled by another magnetic dipole field emitted closely nearby. This substantial cancellation reduces the likelihood of a magnetic dipole field interfering with the switching of the free region.

As used herein, the term "substrate" means and includes a base material or construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOT") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "STT-MRAM cell" means and includes a magnetic cell structure that may include a magnetic tunnel junction ("MTJ"), if a non-magnetic region, disposed between the free region and the fixed region, is electrically insulative (e.g., a dielectric). Alternatively, the magnetic cell structure of the STT-MRAM cell may include a spin valve, if the non-magnetic region, disposed between the free region and the fixed region, is electrically conductive.

As used herein, the term "cell core" means and includes a memory cell structure comprising the free region and fixed region and through which, during operation of the memory cell, current flows to effect a parallel or anti-parallel magnetic orientation within the free region.

As used herein, the term "vertical" means and includes a direction that is perpendicular to the width of the respective region. "Vertical" may also mean and include a direction that is perpendicular to a primary surface of the substrate on which the STT-MRAM cell is located.

As used herein, the term "magnetic material" means and includes both ferromagnetic materials and ferrimagnetic materials.

As used herein, the term "coupler material" means and includes a material formulated to provide RKKY (Ruderman-Kittel-Kasuya-Yosida) interaction, also referred to herein as "anti-parallel coupling" or "antiferromagnetic coupling," between neighboring regions of magnetic material and to effect or encourage a perpendicular anisotropy, i.e., vertical magnetic orientation, within the neighboring regions of magnetic material. For example and without limitation, a coupler material according to embodiments of the present disclosure includes ruthenium (Ru), rhodium (Rh), or combinations thereof.

As used herein, the term "neighboring," when referring to a material, region, or sub-region, means and refers to a next, most proximate material, region, or sub-region of an identified composition. Materials, regions, or sub-regions of other compositions than the identified composition may be disposed between one material, region, or sub-region and its neighboring material, region, or sub-region of the identified composition. For example, a magnetic sub-region "neighboring" a particular coupler sub-region is the magnetic sub-region, e.g., of a plurality of magnetic sub-regions, that is next most proximate to the particular coupler sub-region, which "neighboring" magnetic sub-region may be directly adjacent to the particular coupler sub-region. As another example, a magnetic sub-region "neighboring" a particular magnetic sub-region is the magnetic sub-region, e.g., of a plurality of magnetic sub-regions, that is next most proximate to the particular magnetic sub-region, which "neighboring" magnetic sub-region may be spaced from the particular magnetic sub-region by a material, region, or sub-region of a non-magnetic composition, e.g., a coupler material.

As used herein, the term "sub-region," means and includes a region included in another region. Thus, one region may include a plurality of sub-regions.

As used herein, the term "fixed region" means and includes a region within the STT-MRAM cell that includes magnetic material and that has a fixed magnetic orientation during use and operation of the STT-MRAM cell in that a current effecting a change in the magnetization direction of one magnetic region, e.g., the free region, of the cell core may not effect a change in the magnetization direction of the fixed region.

As used herein, the term "free region" means and includes a region within the STT-MRAM cell that includes magnetic material and that has a switchable magnetic orientation during use and operation of the STT-MRAM cell. The magnetic orientation may be switched between a "parallel" direction, in which the magnetic orientation exhibited by the free region and the magnetic orientation exhibited by the fixed region are directed in the same direction, and an "anti-parallel" direction, in which the magnetic orientation exhibited by the free region and the magnetic orientation exhibited by the fixed region are directed in mutually perpendicular, opposite directions.

As used herein, directionally relative terms, such as "upward," "upwardly directed," and the like, may be used for ease of description to describe one magnetic orientation's or magnetic dipole field's directional relationship to another magnetic orientation or magnetic dipole field. Unless otherwise specified, the directionally relative terms are intended to encompass different directions of the orientations and fields in addition to the directions depicted in the figures. For example, if orientations are switched, magnetic orientations or magnetic dipole fields described or illustrated as "upwardly directed" or "directed upward" would then be "downwardly directed" or "directed downward" and magnetic orientations or magnetic dipole fields described or illustrated as "downwardly directed" or "directed downward" would then be "upwardly directed" or "directed upward." Thus, the term "upward" encompasses a direction that is opposite that encompassed by the term "downward." Thus, for example, the term "upward" can encompass both a direction from south to north and from north to south, and the term "downward" can encompass both a direction from north to south and from south to north, respectively, depending on the context in which the term is used, which will be evident to one of ordinary skill in the art. The magnetic orientations and magnetic dipole fields may be otherwise oriented (rotated 90 degrees, inverted, etc.) and the directionally relative descriptors used herein interpreted accordingly.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, reference to an element as being "on," "over," or "neighboring" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" or "directly adjacent to" another element, there are no intervening elements present.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular material, component, region, sub-region, structure, device, or system, but are merely idealized representations that are employed to describe embodiments of the present disclosure.

Embodiments are described herein with reference to the illustrations. Variations from the shapes of the illustrations as a result, for example, of manufacturing techniques and/or tolerances, are to be expected. Thus, embodiments described herein are not to be construed as being limited to the particular shapes or regions as illustrated but include deviations in shapes that result, for example, from manufacturing. For example, a region illustrated or described as box-shaped may have rough and/or nonlinear features. Moreover, sharp angles that are illustrated may, in practice, be rounded. Thus, the regions illustrated in the figures are schematic in nature and their shapes are not intended to illustrate the precise shape of a region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any conventional technique including, but not limited to, spin coating, blanket coating, chemical vapor deposition ("CVD"), plasma enhanced CVD, atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art.

Reference will now be made to the drawings, wherein like numerals refer to like components throughout. The drawings are not necessarily to scale.

A memory cell is disclosed. The memory cell includes a magnetic region having magnetic material alternating with coupler material, e.g., magnetic sub-regions alternating with coupler sub-regions. The coupler material antiferromagnetically couples neighboring magnetic sub-regions and effects or encourages a vertical magnetic orientation exhibited by the neighboring magnetic sub-regions. Magnetic sub-regions neighboring one another are spaced from one another by a coupler sub-region and exhibit oppositely directed vertical magnetic orientations. The alternating magnetic sub-regions and coupler sub-regions may each be a thickness configured to form the magnetic region (e.g., fixed region, free region) with a compact structure. Interference between magnetic dipole fields emitted from the magnetic region on switching of a free region in the memory cell may be reduced or eliminated.

Figure 4:
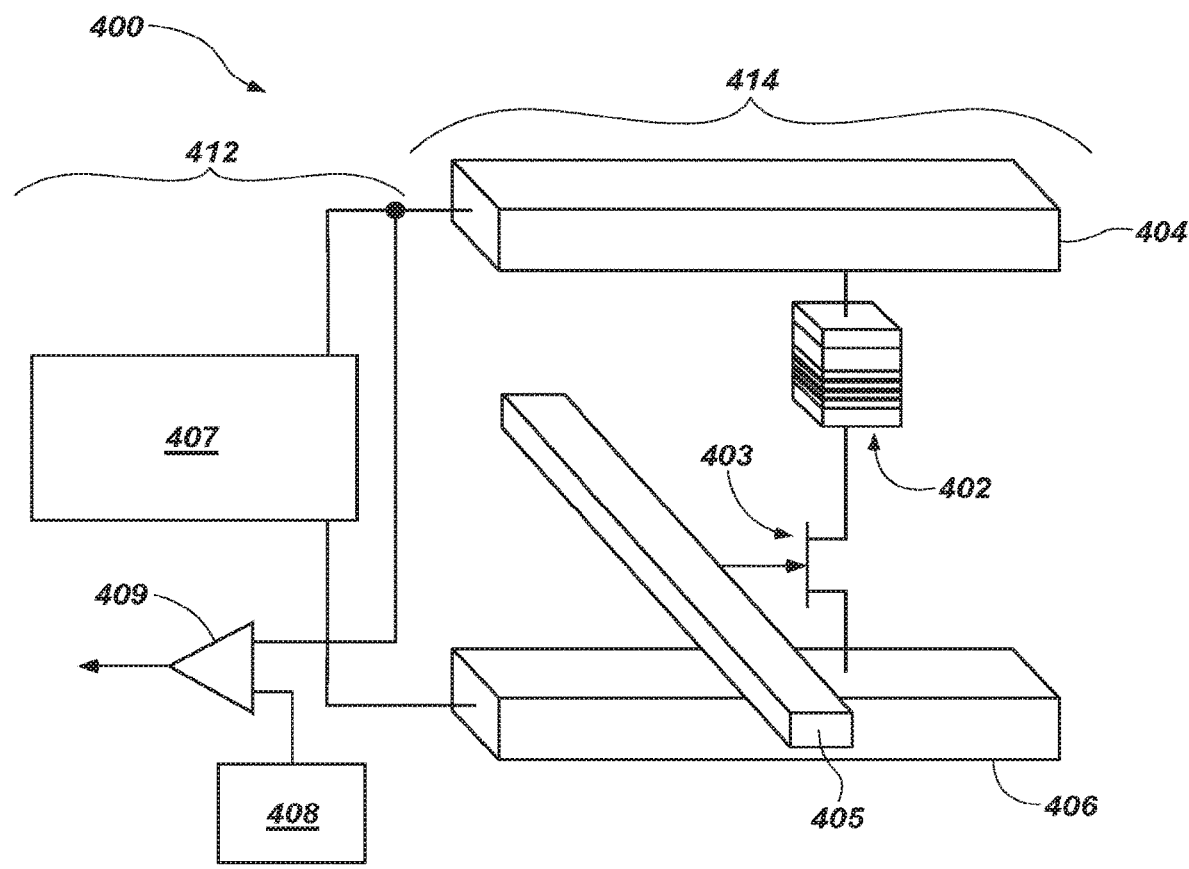
FIG. 4 is a schematic diagram of an STT-MRAM system having a memory cell according to an embodiment of the present disclosure.

FIG. 4 illustrates an STT-MRAM system 400 that includes peripheral devices 412 in operable communication with an STT-MRAM cell 414, a plurality of which may be fabricated to form an array of memory cells in a grid pattern including a number of rows and columns, or in various other arrangements, depending on the system requirements and fabrication technology. The STT-MRAM cell 414 includes a cell core 402, an access transistor 403, a conductive material that may function as a data/sense line 404 (e.g., a bit line), a conductive material that may function as an access line 405 (e.g., a word line), and a conductive material that may function as a source line 406. The peripheral devices 412 of the STT-MRAM system 400 may include read/write circuitry 407, a bit line reference 408, and a sense amplifier 409. The cell core 402 includes a free region and a fixed region with a non-magnetic region disposed therebetween. One or both of the free region and the fixed region may include an alternating structure of magnetic sub-regions and coupler sub-regions. The coupler material of the coupler sub-regions antiferromagnetically couples neighboring magnetic sub-regions and effects a vertical magnetic orientation exhibited by the neighboring magnetic sub-regions.

In use and operation, when an STT-MRAM cell 414 is selected to be programmed, a programming current is applied to the STT-MRAM cell 414, and the current is spin-polarized by the fixed region of the cell core 402 and exerts a torque on the free region of the cell core 402, which switches the magnetization of the free region to "write to" or "program" the STT-MRAM cell 414. In a read operation of the STT-MRAM cell 414, a current is used to detect the resistance state of the cell core 402. Due to the free region, the fixed region, or both regions having the alternating structure of the magnetic sub-regions and coupler sub-regions, the critical switching current utilized to switch the magnetization of the free region from a parallel configuration to an anti-parallel configuration may be essentially the same as the critical switching current utilized to switch the magnetization of the free region from the anti-parallel configuration to the parallel configuration. Further, the alternating structure may further enable use of a cell core 402 with a smaller vertical dimension, thus providing improved scalability and device density. The sequence of magnetic sub-regions and coupler sub-regions may further enhance the stability of the magnetic region including such alternating structure.

To initiate programming of the STT-MRAM cell 414, the read/write circuitry 407 may generate a write current to the data/sense line 404 and the source line 406. The polarity of the voltage between the data/sense line 404 and the source line 406 determines the switch in magnetic orientation of the free region in the cell core 402. Once the free region is magnetized according to the spin polarity of the programming current, the programmed state is written to the STT-MRAM cell 414.

To read the STT-MRAM cell 414, the read/write circuitry 407 generates a read voltage to the data/sense line 404 and the source line 406 through the cell core 402 and the access transistor 403. The programmed state of the STT-MRAM cell 414 relates to the resistance across the cell core 402, which may be determined by the voltage difference between the data/sense line 404 and the source line 406. In some embodiments, the voltage difference may be compared to the bit line reference 408 and amplified by the sense amplifier 409.

Figure 5:
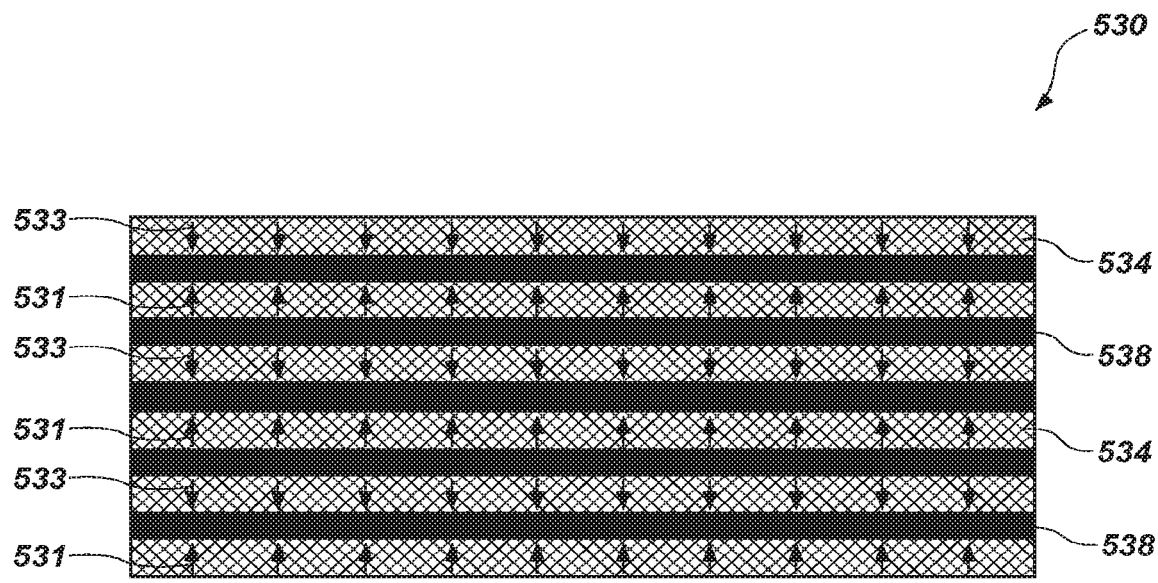
FIG. 5 is a cross-sectional, elevation, schematic illustration of a fixed region of an STT-MRAM cell according to an embodiment of the present disclosure.

With reference to FIG. 5, illustrated is a magnetic region, e.g., a fixed region 530, of a memory cell according to an embodiment of the present disclosure. The fixed region 530 includes alternating magnetic sub-regions 534 and coupler sub-regions 538. That is, the fixed region 530 includes a plurality of magnetic sub-regions 534, each magnetic sub-region 534 spaced from another magnetic sub-region 534 by one of the coupler sub-regions 538. The coupler material of the coupler sub-regions 538 antiferromagnetically couples neighboring magnetic sub-regions 534 and effects therein oppositely directed vertical magnetic orientations 531, 533. Therefore, one magnetic sub-region 534 exhibits the upward vertical magnetic orientation 531 while a neighboring magnetic sub-region 534, which is spaced from the one magnetic sub-region 534 by one coupler sub-region 538, exhibits the downward vertical magnetic orientations 533. The number of alternating magnetic sub-regions 534 and coupler sub-regions 538 may be tailored to achieve the appropriate operation of the fixed region 530 or other magnetic region comprising the alternating structure while emitting little to no stray magnetic dipole field.

The magnetic material of the magnetic sub-regions 534 may comprise ferromagnetic materials or ferrimagnetic materials. For example, without limitation, the magnetic material of the magnetic sub-regions 534 may include Co, Fe, Ni or its alloys, NiFe, CoFe, CoNiFe, or doped alloys CoX, CoFeX, CoNiFeX (where X=B, Cu, Re, Ru, Rh, Hf, Pd, Pt, or C), or other half-metallic ferromagnetic material such as NiMnSb and PtMnSb, for example. In some embodiments, the magnetic material of the magnetic sub-regions 534 may consist essentially of cobalt (Co), e.g., consist only of cobalt (Co).

Figure 3:
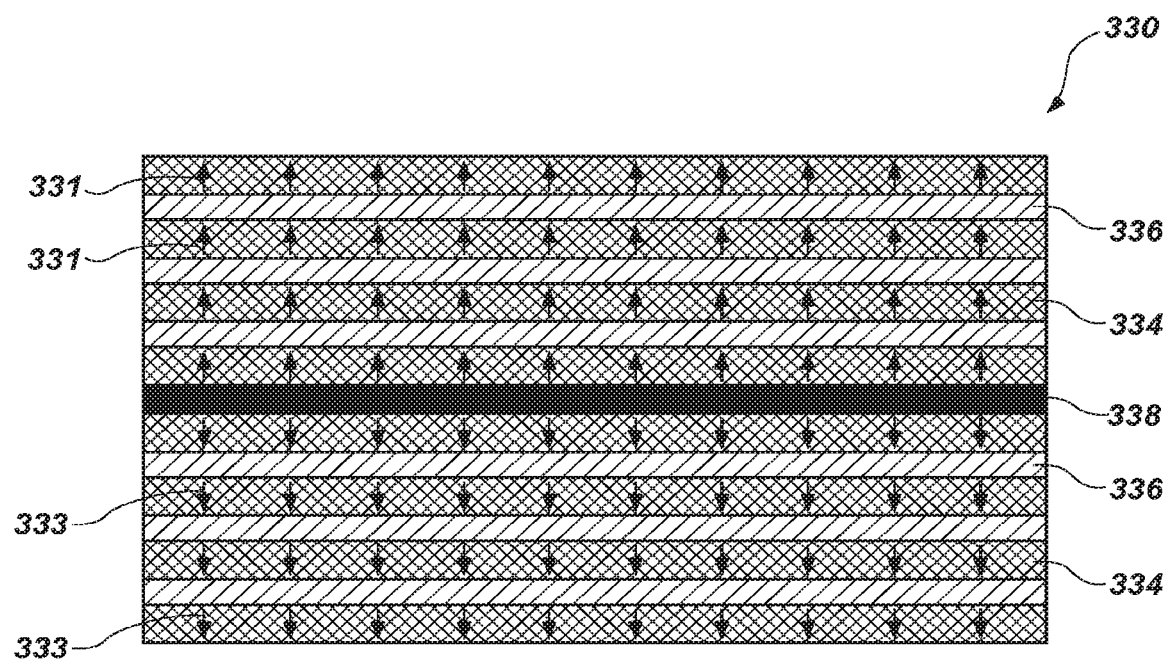
FIG. 3 is a cross-sectional, elevation, schematic illustration of a fixed region of a conventional STT-MRAM cell.

The coupler material of the coupler sub-regions 538 is formulated and positioned to provide RKKY interaction between neighboring magnetic sub-regions 534. The coupler material of the coupler sub-regions 538 is further formulated and positioned to effect or encourage the vertical magnetic orientations 531, 533 exhibited by the neighboring magnetic sub-regions 534. Thus, the coupler material of the coupler sub-regions 538 is a dual-functioning material. Conventional magnetic regions of MRAM cell structures, on the other hand, such as in the fixed region 330 illustrated in FIG. 3, may include a region of coupler material, such as only one layer of coupler material 338, to antiferromagnetically couple regions, i.e., upper and lower regions, of the fixed region 330 while alternating layers of conductive material 336, such as palladium or platinum, are employed to effect the vertical magnetic orientations 331, 333 within the layers of magnetic material 334. With continued reference to FIG. 5, since fewer sub-regions are included in the fixed region 530 according to embodiments of the present disclosure, or in other such magnetic regions utilizing the alternating structure of magnetic sub-regions and coupler sub-regions, the structure of a magnetic region (e.g., the fixed region 530) may be more compact than that of a conventional magnetic region (e.g., fixed region 330 of FIG. 3). For example, a height of the fixed region 530 may be about one-half the height of a conventional fixed region (e.g., the fixed region 330 of FIG. 3). In some embodiments, the fixed region 530, or other magnetic region of an alternating structure according to the present disclosure, may be free of palladium, platinum, or both, because the function accomplished by such materials in a conventional magnetic region is accomplished by the coupler material of the coupler sub-regions 538 of the magnetic region (e.g., fixed region 530) according to the present disclosure.

The coupler material of the coupler sub-regions 538 may be formed from one or more materials formulated and positioned to antiferromagnetically couple neighboring magnetic sub-regions 534. For example, without limitation, the coupler material of the coupler sub-regions 538 may be formed from one or more of ruthenium (Ru) and rhodium (Rh).

Because the vertical magnetic orientations 531, 533 alternate in vertical direction, from one magnetic sub-region 534 to the neighboring magnetic sub-region 534, a magnetic dipole field emitted by one of the magnetic sub-regions 534 within the fixed region 530 may be substantially or wholly cancelled by an oppositely directed magnetic dipole field emitted by one or two neighboring magnetic sub-regions 534. Therefore, the likelihood of a magnetic dipole field being generated from the fixed region 530 and interfering with switching of a free region is minimized.

The thicknesses of the magnetic sub-regions 534 and coupler sub-regions 538 may be tailored to achieve a desired outcome. In some embodiments, each sub-region 534, 538 is formed as a single monolayer of the magnetic material or coupler material, respectively. In other embodiments, each sub-region 534, 538 includes about one monolayer to about five monolayers, e.g., about three monolayers, of the magnetic material or coupler material, respectively. Each sub-region 534, 538 may define a thickness (e.g., height) less than about one nanometer. For example, the magnetic sub-regions 534 may have a thickness (e.g., height) of less than about four angstroms (4 Å), e.g., a height of about 2 Å to about 3 Å. In those or other embodiments, the coupler sub-regions 538 may have a thickness (e.g., height) of less than about 6 Å, e.g., a height of about 3 Å to about 5 Å, e.g., about 4 Å.

The fixed region 530, or other magnetic region utilizing the alternating structure of magnetic sub-regions 534 and coupler sub-regions 538, may be formed by sequentially forming the coupler sub-regions 538 and the magnetic sub-regions 534, etc., i.e., forming a magnetic sub-region 534, then forming a coupler sub-region 538 on the magnetic sub-region 534, then forming another magnetic sub-region 534 on the coupler sub-region 538, then forming another coupler sub-region 538 on the another magnetic sub-region 534, etc. The lowest and uppermost sub-regions of the fixed region 530, or other magnetic region with alternating structure, may be magnetic sub-regions 534, as illustrated in FIG. 5.

The magnetic sub-regions 534 and the coupler sub-regions 538 may be formed by PVD, by sputtering, by another conventional material-formation process, or any combination thereof. The magnetic sub-regions 534 and the coupler sub-regions 538 may be formed in the same fabrication tool.

Figure 6:
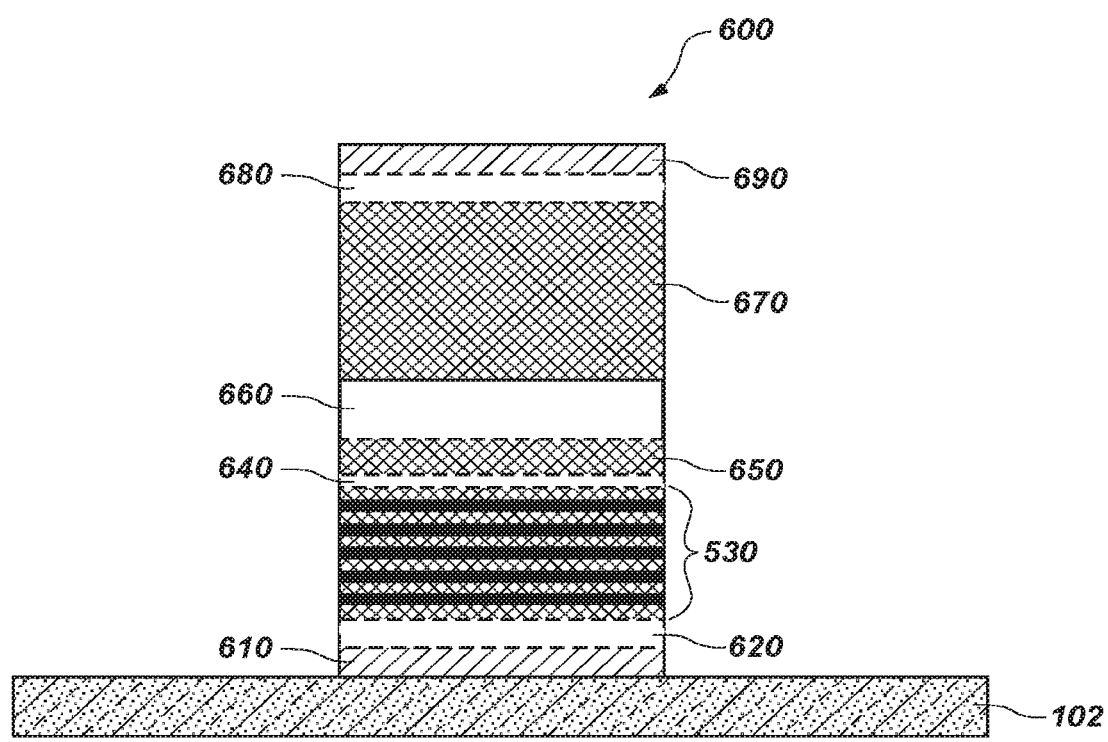
FIG. 6 is a cross-sectional, elevation, schematic illustration of a cell core structure of an STT-MRAM cell according to an embodiment of the present disclosure, the STT-MRAM cell including the fixed region of FIG. 5.

The fabricated alternating structure of magnetic sub-regions 534 and coupler sub-regions 538 (FIG. 5) may thereafter be patterned, i.e., etched, along with other materials disposed above or below to form a cell core structure 600, as illustrated in FIG. 6. Because the fixed region 530 may be free of materials such as palladium and platinum, which are traditionally difficult to etch, patterning the fixed region 530 to form the cell core structure 600 may be easier than patterning a fixed region containing materials such as palladium and platinum, e.g., the fixed region 330 of FIG. 3. Patterning may also be made easier due to the compact structure of the fixed region 530, or other magnetic region of alternating structure, relative to the structure of a conventional fixed region (e.g., fixed region 330 of FIG. 3), or other magnetic region without the alternating structure, respectively.

With continued reference to FIG. 6, the resulting cell core structure 600 may include cell core regions below and above the fixed region 530. For example, the fixed region 530 may be formed over a lower conductive material 610 supported by the substrate 102. One or more lower intermediary regions 620 may be disposed between the lower conductive material 610 and a lower surface of the fixed region 530. The lower conductive material 610 may form part of a bottom electrode. The lower intermediary region or regions 620 may include non-magnetic regions, transitional regions, diffusion barriers, buffers, compatibility regions, other regions of a conventional STT-MRAM cell, or any combination thereof.

Optionally, a transitional region 640, a reference region 650, or both may be formed above the fixed region 530. The transitional region 640, if included, may include a non-magnetic material, e.g., tantalum, titanium, nitrides thereof, or combinations thereof. The transitional region 640 may be formed to be of a thickness tailored such that the uppermost magnetic sub-region 534 (FIG. 5) of the fixed region 530 may magnetically interact with the reference region 650, if included in the cell core structure 600. The transitional region 640, if included, may be used to form the magnetic sub-regions 534 (FIG. 5) and the coupler sub-regions 538 (FIG. 5) in a desired crystalline structure. Therefore, in some embodiments, the magnetic region of the alternating structure (e.g., fixed region 530) may include a superlattice structure of the magnetic sub-regions 534 (FIG. 5) and coupler sub-regions 538 (FIG. 5).

The reference region 650 may include magnetic material that may be of the same or different composition as the magnetic material of the magnetic sub-regions 534 (FIG. 5) of the fixed region 530. If present, the reference region 650 may exhibit a vertical magnetic orientation that may influence a net vertical magnetic orientation of the fixed region 530. For example, the reference region 650 may be magnetically polarized and positioned to exhibit a downwardly directed vertical magnetic orientation. In such a situation, the uppermost magnetic sub-region 534 (FIG. 5) of the fixed region 530 may likewise exhibit a downwardly directed vertical magnetic orientation 533 (as illustrated in FIG. 5). In such embodiments, magnetic sub-regions 534 within the fixed region 530 exhibiting an upwardly directed vertical magnetic orientation 531 may be thicker than the magnetic sub-regions 534 exhibiting the downwardly directed vertical magnetic orientation 533 so as to achieve an essential cancellation of the downwardly directed vertical magnetic orientations 533 and the upwardly directed vertical magnetic orientations 531 within the fixed region 530 and the reference region 650.

With continued reference to FIG. 6, a non-magnetic region 660 may be disposed between the fixed region 530 and a free region 670. In embodiments in which the cell core structure 600 includes the reference region 650, the non-magnetic region 660 may be disposed between the reference region 650 and the free region 670. The non-magnetic region 660 may comprise $Al_xO_y$, MgO, AlN, SiN, $CaO_x$, $NiO_x$, $Hf_xO_y$, $Ta_xO_y$, $Zr_xO_y$, $NiMnO_x$, $Mg_xF_y$, SiC, $SiO_2$, $SiO_xN_y$, or any combination of the above materials. In some embodiments, the non-magnetic region 660 may comprise an electrically insulating material, and the non-magnetic region 660 may be configured as an MTJ. In other embodiments, the non-magnetic region 660 may comprise electrically conductive material, and the non-magnetic region 660 may be configured as a spin valve.

The free region 670 includes magnetic material that may be of the same or different composition as the magnetic material of the magnetic sub-regions 534 (FIG. 5) within the fixed region 530. In some embodiments, the free region 670 may be a conventional free region, i.e., a magnetic region not including the alternating structure of magnetic sub-regions 534 (FIG. 5) and coupler sub-regions 538 (FIG. 5).

One or more upper intermediary regions 680 may be formed over the free region 670, and an upper conductive region 690 may be formed as the uppermost region of the cell core structure 600. The upper intermediary regions 680, if included, may be any one or more of the regions discussed above with regard to the lower intermediary region or regions 620. The upper conductive region 690 may form a part of a top electrode, such that the upper conductive region 690 may function as the data/sense line 404 (FIG. 4). The cell core structure 600 may therefore be implemented in the STT-MRAM cell 414 of FIG. 4.

Though FIG. 6 depicts the free region 670 as being disposed above the fixed region 530, in other embodiments, the free region 670 may be disposed below the fixed region 530. Further, one of ordinary skill in the art will recognize that the magnetic orientations (e.g., vertical magnetic orientations 531, 533 of FIG. 5) could be oppositely illustrated without altering the function of the respective magnetic sub-regions (e.g., magnetic sub-regions 534 of FIG. 5).

The cell core structure 600 of FIG. 6 may achieve a substantially symmetrically switchable free region 670 because the compact, alternating structure of the fixed region 530 is such that magnetic dipole fields emitted from the fixed region 530 are minimized (e.g., due to the thin dimension of the magnetic sub-regions 534 (FIG. 5)) and are substantially cancelled (e.g., due to the alternating pattern of oppositely oriented magnetic sub-regions 534 (FIG. 5)). Further, because the materials of a plurality of cell core structures 600 could be formed and then patterned simultaneously, the structure of the fixed region 530 may accommodate forming a number of cell core structures 600 with substantial uniformity among the cell core structures 600 so formed.

Magnetic regions of the alternating structure, i.e., alternating magnetic sub-regions 534 and coupler sub-regions 538, such as the fixed region 530 illustrated in FIGS. 5 and 6, may be utilized elsewhere in a cell core structure of a magnetic memory cell. Such magnetic regions of alternating structures may be configured to function as additional fixed regions, as free regions, as reference regions, or any combination thereof. The number of sub-regions, the materials, and the dimensions utilized in the alternating structure may be tailored to achieve the desired functionality of the fixed region, free region, reference region, or combinations thereof, respectively. For example, the number of sub-regions included in a free region may be a number selected to accommodate switching of the magnetic orientation of the free region during operation of the MRAM cell, while the number of sub-regions included in a fixed region may be a number selected to avoid switching of the magnetic orientation during operation.

Further, though the alternating structure, e.g., the structure of the fixed region 530 (FIG. 5), as disclosed and described herein, minimizes the negative interference between a stray magnetic dipole field from the fixed region 530 and the free region (e.g., free region 670 of FIG. 6), the structure of the cell core may be further configured to minimize such interference.

Figure 7:
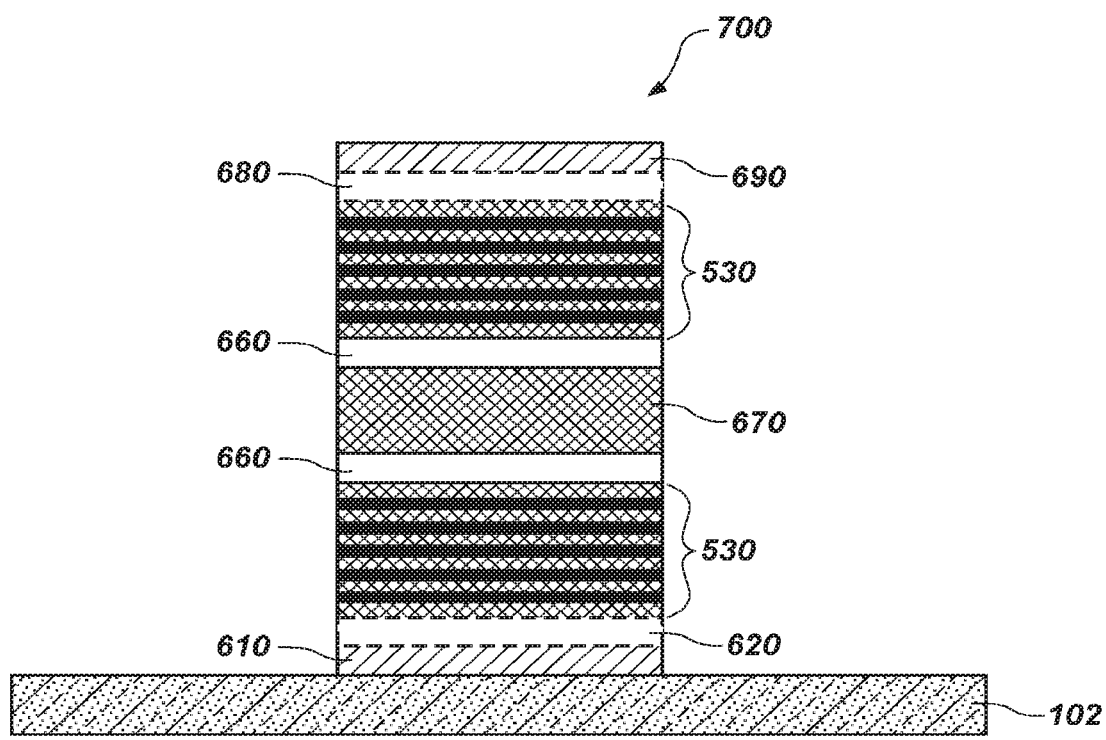
FIG. 7 is a cross-sectional, elevation, schematic illustration of a cell core structure of an STT-MRAM cell according to an embodiment of the present disclosure, the STT-MRAM cell including two fixed regions of FIG. 5 disposed on either side, i.e., top and bottom, of a free region.

For example, with reference to FIG. 7, according to another embodiment of the present disclosure, a cell core structure 700 may include more than one fixed region 530, e.g., two fixed regions 530, each having an alternating structure as illustrated and discussed above with regard to FIG. 5. The fixed regions 530 may be disposed essentially symmetrically above and below the free region 670. As such, the cell core structure 700 may be configured so that a magnetic dipole field emitted toward the free region 670 by one of the fixed regions 530 may be cancelled by a magnetic dipole field emitted toward the free region 670, from the other direction, by another of the fixed regions 530. Therefore, not only does the cell core structure 700 minimize the magnetic dipole field interference by utilizing the alternating structure of magnetic sub-regions 534 (FIG. 5) and coupler sub-regions 538 (FIG. 5), it also symmetrically disposes fixed regions 530 relative to the free region 670 to further cancel stray magnetic dipole fields.

Figure 8:
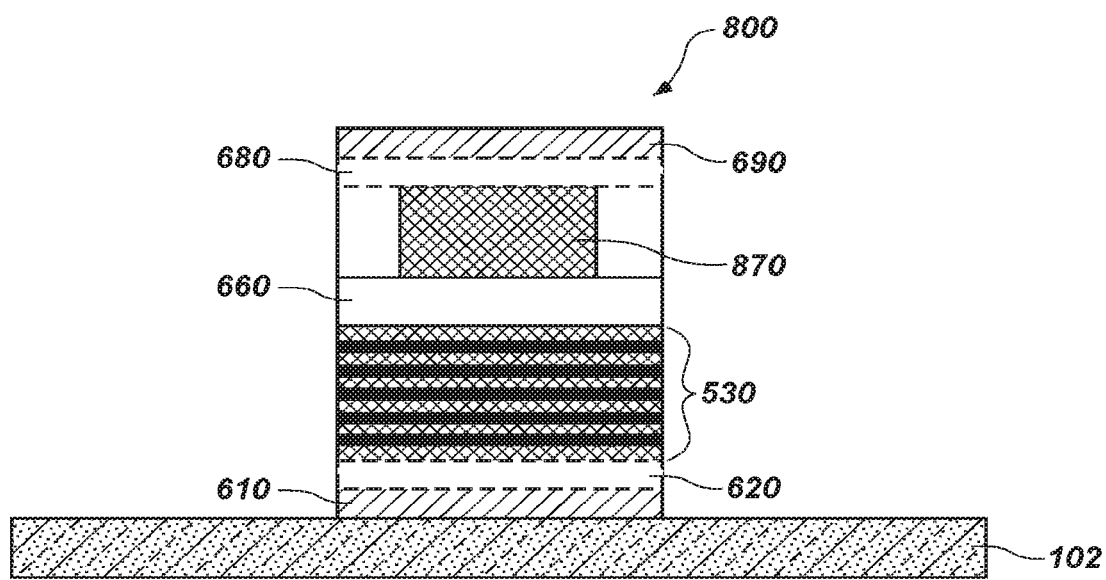
FIG. 8 is a cross-sectional, elevation, schematic illustration of a cell core structure of an STT-MRAM cell according to an embodiment of the present disclosure, the STT-MRAM cell including the fixed region of FIG. 5 and a narrow free region.

As another example, with reference to FIG. 8, in another cell core structure 800 according to an embodiment of the present disclosure, a free region 870 may be formed to have a smaller lateral dimension (e.g., width) than a lateral dimension (e.g., width) of the fixed region 530. The cell core structure 800 may therefore be configured to inhibit interference between a magnetic dipole field emitted by the fixed region 530, which may be emitted most strongly near sidewalls of the fixed region 530, and the free region 870, which, as illustrated, may not vertically overlap the sidewalls of the fixed region 530 from which the magnetic dipole field is most strongly emitted. Therefore, the alternating structure of the fixed region 530 and the narrower free region 870 each minimize magnetic dipole field interference of the free region 870 switching.

Figure 9:
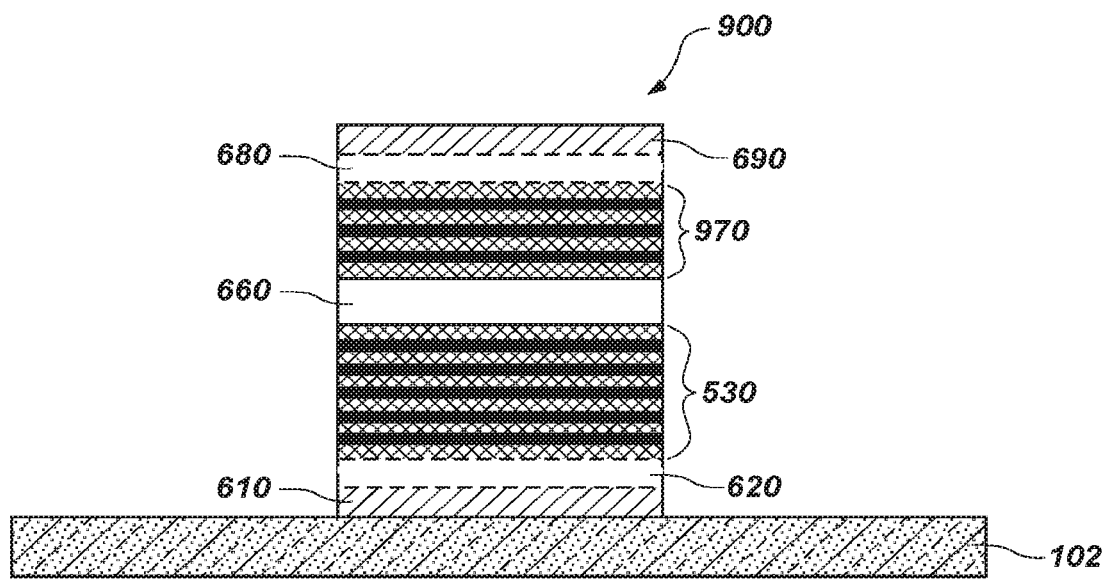
FIG. 9 is a cross-sectional, elevation, schematic illustration of a cell core structure of an STT-MRAM cell according to an embodiment of the present disclosure, the STT-MRAM cell including the fixed region of FIG. 5 and a free region of a structure according to an embodiment of the present disclosure.

As still another example, with reference to FIG. 9, a cell core structure 900 may include not only the fixed region 530 having the alternating structure, but also a free region 970 with an alternating structure. The number of alternating magnetic sub-regions 534 (FIG. 5) and coupler sub-regions 538 (FIG. 5) may be tailored to ensure switchability of the magnetic orientation of the free region 970 during operation. In some such embodiments, the free region 970 may include fewer alternating sub-regions than the fixed region 530. Because of the alternating structure, the effects of stray magnetic dipole fields may be further minimized.

Figure 10:
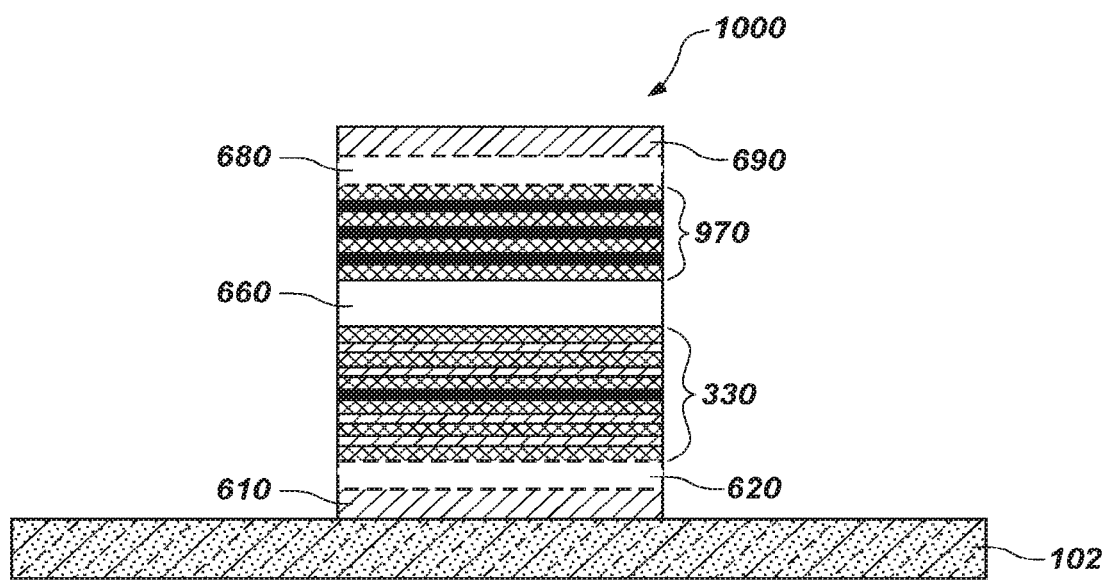
FIG. 10 is a cross-sectional, elevation, schematic illustration of a cell core structure of an STT-MRAM cell according to an embodiment of the present disclosure, the STT-MRAM cell including the fixed region of FIG. 3 and the free region of FIG. 9.

In other embodiments, such as that illustrated in FIG. 10, a cell core structure 1000 may utilize the alternating structure in the free region 970 but not in other magnetic regions, such as in the fixed region. Accordingly, the free region 970 of the present disclosure may be utilized in conjunction with a conventional fixed region, e.g., the fixed region 330 of FIG. 3. The free region 970 of the alternating structure may nonetheless experience less switching interference from stray magnetic dipole fields (e.g., a magnetic dipole field emitted by the fixed region 330) than a free region of a conventional cell core structure (e.g., free region 670 of FIG. 7).

Figure 11:
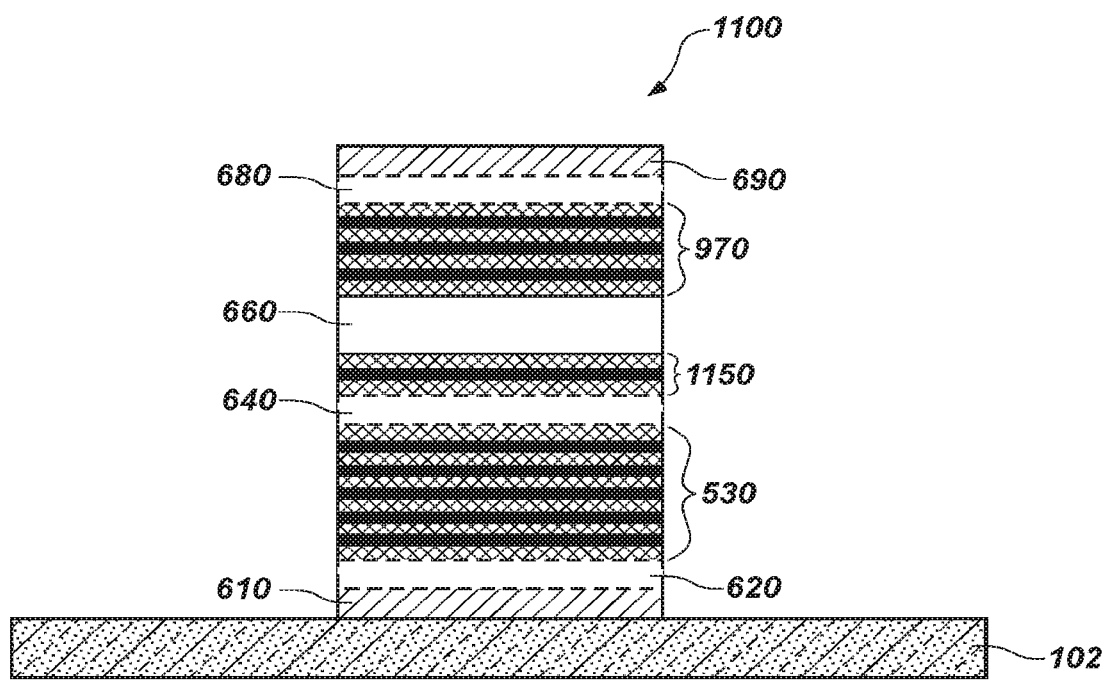
FIG. 11 is a cross-sectional, elevation, schematic illustration of a cell core structure of an STT-MRAM cell according to an embodiment of the present disclosure, the STT-MRAM cell including the fixed region of FIG. 5, the free region of FIG. 9, and a reference region of a structure according to an embodiment of the present disclosure.

In still other embodiments, each of the magnetic regions of a cell core structure 1100 may include the alternating structure, as illustrated in FIG. 11. Accordingly, each of the fixed region 530, the free region 970, and a reference region 1150 may include the alternating structure of magnetic sub-regions 534 (FIG. 5) and coupler sub-regions 538 (FIG. 5). Again, the number of alternating sub-regions, the materials thereof, the dimensions (e.g., thicknesses, widths) thereof, and the dispositions thereof relative to other magnetic regions may be tailored to ensure effective operation of the cell core structure 1100. For example, the reference region 1150 may include fewer alternating sub-regions than the free region 970, which may include fewer alternating sub-regions than the fixed region 530.

Accordingly, disclosed is a memory cell comprising a magnetic region. The magnetic region comprises an alternating structure of magnetic material and coupler material. The magnetic region exhibits a vertical magnetic orientation.

Also disclosed is a method of forming a memory cell, comprising forming a magnetic region. Forming a magnetic region comprises forming a magnetic sub-region exhibiting a vertical magnetic orientation. A coupler sub-region is formed on the magnetic sub-region. Another magnetic sub-region is formed on the coupler sub-region. The another magnetic sub-region exhibits another vertical magnetic orientation oppositely directed to the vertical magnetic orientation exhibited by the magnetic sub-region. Another coupler sub-region is formed on the another magnetic sub-region.

Moreover, disclosed is a memory cell comprising at least two magnetic regions. At least one of the at least two magnetic regions comprises coupler sub-regions. Each of the coupler sub-regions is separated from another of the coupler sub-regions by a magnetic sub-region exhibiting a vertical magnetic orientation.

Further, disclosed is a memory cell comprising a magnetic region comprising a plurality of magnetic sub-regions. At least one magnetic sub-region of the plurality exhibits a vertical magnetic orientation with opposing vertical magnetic orientations exhibited by a pair of neighboring magnetic sub-regions of the plurality.

Figure 12:
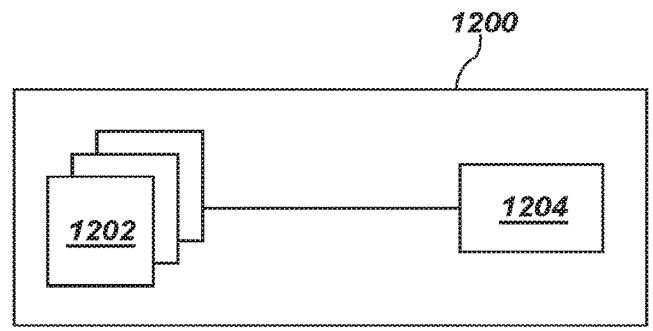
FIG. 12 is a simplified block diagram of a semiconductor device structure including memory cells of an embodiment of the present disclosure.

Also disclosed is a semiconductor device structure including at least one STT-MRAM cell, e.g., an array of STT-MRAM cells. With reference to FIG. 12, illustrated is a simplified block diagram of a semiconductor device structure 1200 implemented according to one or more embodiments described herein. The semiconductor device structure 1200 includes a memory array 1202 and a control logic component 1204. The memory array 1202 may include a plurality of the STT-MRAM cells 414 (FIG. 4) including any of the cell core structures 600 (FIG. 6), 700 (FIG. 7), 800 (FIG. 8), 900 (FIG. 9), 1000 (FIG. 10), 1100 (FIG. 11) discussed above, which cell core structures 600, 700, 800, 900, 1000, 1100 may have been formed according to a method described above. The control logic component 1204 may be configured to operatively interact with the memory array 1202 so as to read from or write to any or all memory cells (e.g., STT-MRAM cell 414) within the memory array 1202.

Accordingly, disclosed is a semiconductor device structure comprising a spin torque transfer magnetic random-access memory (STT-MRAM) array. The array comprises a plurality of STT-MRAM cells. Each STT-MRAM cell of the plurality comprises a cell core comprising a magnetic region exhibiting a vertical magnetic orientation. The magnetic region comprises a plurality of spaced sub-regions of a coupler material.

Figure 13:
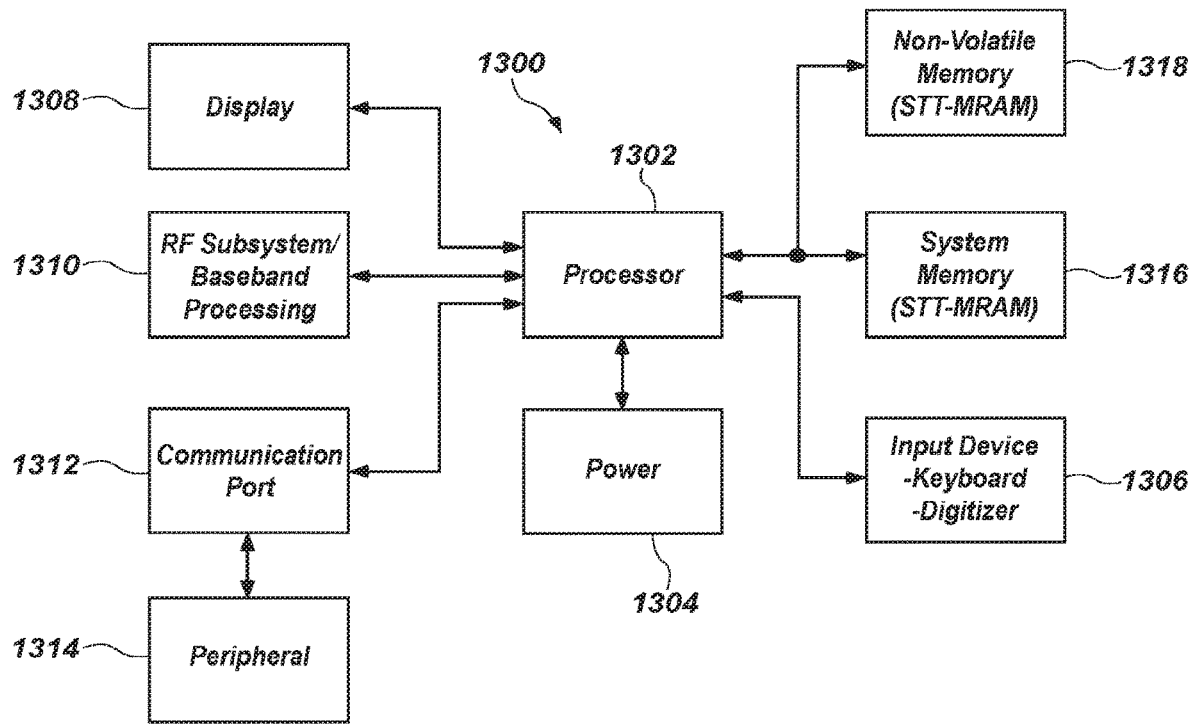
FIG. 13 is a simplified block diagram of a system implemented according to one or more embodiments of the present disclosure.

Also disclosed is a system including a memory array, e.g., memory array 1202. With reference to FIG. 13, depicted is a processor-based system 1300. The processor-based system 1300 may include various electronic devices manufactured in accordance with embodiments of the present disclosure. The processor-based system 1300 may be any of a variety of types such as a computer, pager, cellular phone, personal organizer, control circuit, or other electronic device. The processor-based system 1300 may include one or more processors 1302, such as a microprocessor, to control the processing of system functions and requests in the processor-based system 1300. The processor 1302 and other subcomponents of the processor-based system 1300 may include magnetic memory devices manufactured in accordance with embodiments of the present disclosure.

The processor-based system 1300 may include a power supply 1304. For example, if the processor-based system 1300 is a portable system, the power supply 1304 may include one or more of a fuel cell, a power scavenging device, permanent batteries, replaceable batteries, and rechargeable batteries. The power supply 1304 may also include an AC adapter; therefore, the processor-based system 1300 may be plugged into a wall outlet, for example. The power supply 1304 may also include a DC adapter such that the processor-based system 1300 may be plugged into a vehicle cigarette lighter, for example.

Various other devices may be coupled to the processor 1302 depending on the functions that the processor-based system 1300 performs. For example, a user interface 1306 may be coupled to the processor 1302. The user interface 1306 may include input devices such as buttons, switches, a keyboard, a light pen, a mouse, a digitizer and stylus, a touch screen, a voice recognition system, a microphone, or a combination thereof. A display 1308 may also be coupled to the processor 1302. The display 1308 may include an LCD display, an SED display, a CRT display, a DLP display, a plasma display, an OLED display, an LED display, a three-dimensional projection, an audio display, or a combination thereof. Furthermore, an RF sub-system/baseband processor 1310 may also be coupled to the processor 1302. The RF sub-system/baseband processor 1310 may include an antenna that is coupled to an RF receiver and to an RF transmitter (not shown). A communication port 1312, or more than one communication port 1312, may also be coupled to the processor 1302. The communication port 1312 may be adapted to be coupled to one or more peripheral devices 1314, such as a modem, a printer, a computer, a scanner, or a camera, or to a network, such as a local area network, remote area network, intranet, or the Internet, for example.

The processor 1302 may control the processor-based system 1300 by implementing software programs stored in the memory. The software programs may include an operating system, database software, drafting software, word-processing software, media-editing software, or media-playing software, for example. The memory is operably coupled to the processor 1302 to store and facilitate execution of various programs. For example, the processor 1302 may be coupled to system memory 1316, which may include one or more of spin torque transfer magnetic random-access memory (STT-MRAM), magnetic random-access memory (MRAM), dynamic random-access memory (DRAM), static random-access memory (SRAM), racetrack memory, and other known memory types. The system memory 1316 may include volatile memory, non-volatile memory, or a combination thereof. The system memory 1316 is typically large so that it can store dynamically loaded applications and data. In some embodiments, the system memory 1316 may include semiconductor device structures, such as the semiconductor device structure 1200 of FIG. 12, memory cells including any of cell core structures 600 (FIG. 6), 700 (FIG. 7), 800 (FIG. 8), 900 (FIG. 9), 1000 (FIG. 10), 1100 (FIG. 11), or a combination thereof.

The processor 1302 may also be coupled to non-volatile memory 1318, which is not to suggest that system memory 1316 is necessarily volatile. The non-volatile memory 1318 may include one or more of STT-MRAM, MRAM, read-only memory (ROM) such as an EPROM, resistive read-only memory (RROM), and Flash memory to be used in conjunction with the system memory 1316. The size of the non-volatile memory 1318 is typically selected to be just large enough to store any necessary operating system, application programs, and fixed data. Additionally, the non-volatile memory 1318 may include a high capacity memory such as disk drive memory, such as a hybrid-drive including resistive memory or other types of non-volatile solid-state memory, for example. The non-volatile memory 1318 may include semiconductor device structures, such as the semiconductor device structure 1200 of FIG. 12, memory cells including any of cell core structures 600 (FIG. 6), 700 (FIG. 7), 800 (FIG. 8), 900 (FIG. 9), 1000 (FIG. 10), 1100 (FIG. 11), or a combination thereof.

Accordingly, disclosed is a spin torque transfer magnetic random-access memory (STT-MRAM) system, comprising at least one magnetic memory cell comprising a magnetic region comprising a plurality of sub-regions of magnetic material. A sub-region of the plurality exhibits a vertical magnetic orientation oppositely directed to another vertical magnetic orientation exhibited by another sub-region of the plurality. The STT-MRAM system also comprises at least one peripheral device in operable communication with the at least one magnetic memory cell.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. An apparatus, comprising:
a fixed region exhibiting a fixed vertical magnetic orientation; and
a free region exhibiting a switchable vertical magnetic orientation, the free region comprising an alternating structure of magnetic sub-regions and coupler sub-regions, at least one of the magnetic sub-regions having an oppositely directed magnetic orientation as a magnetic orientation of two of the nearest magnetic sub-regions, wherein a magnetic dipole field emitted by the at least one of the magnetic sub-regions is configured to be substantially canceled by an oppositely directed magnetic dipole field emitted from one or two neighboring magnetic sub-regions of the one of the magnetic sub-regions.

2. The apparatus of claim 1, wherein the magnetic sub-regions comprise cobalt, nickel, iron, or alloys thereof.

3. The apparatus of claim 1, wherein the coupler sub-regions comprise one or both of ruthenium and rhodium.

4. The apparatus of claim 1, wherein each of the magnetic sub-regions and the coupler sub-regions individually comprise a monolayer.

5. The apparatus of claim 1, wherein each of the magnetic sub-regions and the coupler sub-regions individually comprise from about one monolayer to about five monolayers.

6. The apparatus of claim 1, wherein the fixed region comprises another alternating structure of magnetic sub-regions and coupler sub-regions.

7. The apparatus of claim 6, wherein the free region comprises fewer alternating magnetic sub-regions and coupler sub-regions than the fixed region.

8. The apparatus of claim 1, wherein the free region comprises one more coupler sub-region than a number of magnetic sub-regions.

9. A cell core structure, comprising:
a fixed region exhibiting a fixed vertical magnetic orientation;
a transitional region comprising a non-magnetic material adjacent to the fixed region; and
a free region exhibiting a switchable vertical magnetic orientation adjacent to the transitional region, one or both of the fixed region and the free region comprising an alternating structure of magnetic sub-regions and coupler sub-regions, more than one of the magnetic sub-regions located between two other magnetic sub-regions and having an oppositely directed magnetic orientation relative to a magnetic orientation of the two other magnetic sub-regions.

10. The cell core structure of claim 9, wherein the transitional region comprises tantalum, titanium, nitrides thereof, or combinations thereof.

11. The cell core structure of claim 9, further comprising a non-magnetic material adjacent to the transitional region and between the free region and the fixed region.

12. The cell core structure of claim 9, wherein an uppermost sub-region of the alternating structure comprises a coupler sub-region and a lowermost sub-region of the alternating structure comprises a coupler sub-region.

13. The cell core structure of claim 9, wherein the free region is configured to emit a stronger magnetic dipole field near sidewalls thereof.

14. A system, comprising:
a processor; and
a magnetic structure comprising a magnetic cell core coupled to the processor, the magnetic cell core comprising:
a fixed region comprising a first alternating structure of magnetic sub-regions and coupler sub-regions, each magnetic sub-region spaced from another magnetic sub-region by one of the coupler sub-regions and having an oppositely directed magnetic orientation as neighboring magnetic sub-regions, each coupler sub-region of the fixed region configured to effect anti-parallel coupling in at least one adjacent magnetic sub-structure of the fixed region;
a non-magnetic region adjacent to the fixed region; and
a free region adjacent to the non-magnetic region, the free region comprising a second alternating structure of magnetic sub-regions and coupler sub-regions, each magnetic sub-region spaced from another magnetic sub-region by one of the coupler sub-regions and having an oppositely directed magnetic orientation as neighboring magnetic sub-regions.

15. The system of claim 14, further comprising a reference region comprising a magnetic material between the fixed region and the free region.

16. The system of claim 15, wherein the reference region comprises a third alternating structure of magnetic sub-regions and coupler sub-regions.

17. The system of claim 16, wherein the reference region comprises fewer magnetic sub-regions and coupler sub-regions than the free region.

18. An apparatus, comprising:
a fixed region exhibiting a fixed vertical magnetic orientation; and
a free region exhibiting a switchable vertical magnetic orientation, the free region comprising an alternating structure of magnetic sub-regions and coupler sub-regions, at least one of the magnetic sub-regions having an oppositely directed magnetic orientation as a magnetic orientation of two of the nearest magnetic sub-regions, each of the magnetic sub-regions and the coupler sub-regions individually comprising from about one monolayer to about five monolayers.

* * * * *

UNITED STATES PATENT AND TRADEMARK OFFICE
CERTIFICATE OF CORRECTION

PATENT NO. : 11,158,670 B2
APPLICATION NO. : 16/796677
DATED : October 26, 2021
INVENTOR(S) : Wayne I. Kinney, Witold Kula and Stephen J. Kramer Page 1 of 1

It is certified that error appears in the above-identified patent and that said Letters Patent is hereby corrected as shown below:

In the Specification
Column 5, Line 34, change "("SOT")" to --("SOI")--

Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*